United States Patent
Hata

(10) Patent No.: US 11,652,145 B2
(45) Date of Patent: May 16, 2023

(54) NITRIDE SEMICONDUCTOR DEVICE COMPRISING LAYERED STRUCTURE OF ACTIVE REGION AND METHOD FOR MANUFACTURING THE SAME

(71) Applicant: ROHM CO., LTD., Kyoto (JP)

(72) Inventor: Yosuke Hata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 571 days.

(21) Appl. No.: 16/591,677

(22) Filed: Oct. 3, 2019

(65) Prior Publication Data

US 2020/0111877 A1 Apr. 9, 2020

(30) Foreign Application Priority Data

Oct. 5, 2018 (JP) .............................. JP2018-190199

(51) Int. Cl.
H01L 29/778 (2006.01)
H01L 29/20 (2006.01)

(52) U.S. Cl.
CPC ...... *H01L 29/2003* (2013.01); *H01L 29/7786* (2013.01)

(58) Field of Classification Search
None
See application file for complete search history.

(56) References Cited

U.S. PATENT DOCUMENTS

| | | | | |
|---|---|---|---|---|
| 2006/0273347 A1* | 12/2006 | Hikita | ................. | H01L 29/7783 257/E29.252 |
| 2008/0149940 A1* | 6/2008 | Shibata | ............... | H01L 23/4824 257/E29.252 |
| 2013/0075751 A1* | 3/2013 | Imanishi | ............. | H01L 29/7787 257/E21.403 |
| 2013/0099324 A1 | 4/2013 | Huang et al. | | |

FOREIGN PATENT DOCUMENTS

| | | |
|---|---|---|
| GN | 106206295 A | 12/2016 |
| JP | 2004273486 A | 9/2004 |
| JP | 2016529710 A | 9/2016 |

OTHER PUBLICATIONS

Japanese Patent Office: Notice of Reasons for Refusal for Japanese Patent Application No. 2018-190199 (related application); Onda, Kazuhiko; Apr. 28, 2022; 10 pages.
Japanese Patent Office: Decision of Refusal of JP Application No. 2018-190199 (related application); Onda, Kazuhiko; Oct. 27, 2022; 8 pages.

\* cited by examiner

*Primary Examiner* — Daniel Whalen
(74) *Attorney, Agent, or Firm* — Gregory M. Howison

(57) ABSTRACT

A nitride semiconductor device includes a channel layer, a barrier layer made of $Al_xIn_yGa_{1-x-y}N$ ($x>0$, $x+y\leq 1$), an active region that has a layered structure including the channel layer and the barrier layer, an inactive region that is formed at the layered structure around the active region and that is a concave portion having a bottom portion that reaches the channel layer, a gate layer made of a nitride semiconductor (Continued)

selectively formed on the barrier layer in the active region, a gate electrode formed on the gate layer, a first insulating film that covers the gate electrode and that is in contact with the barrier layer in the active region, and a second insulating film that covers the first insulating film and that is in contact with the inactive region.

16 Claims, 35 Drawing Sheets

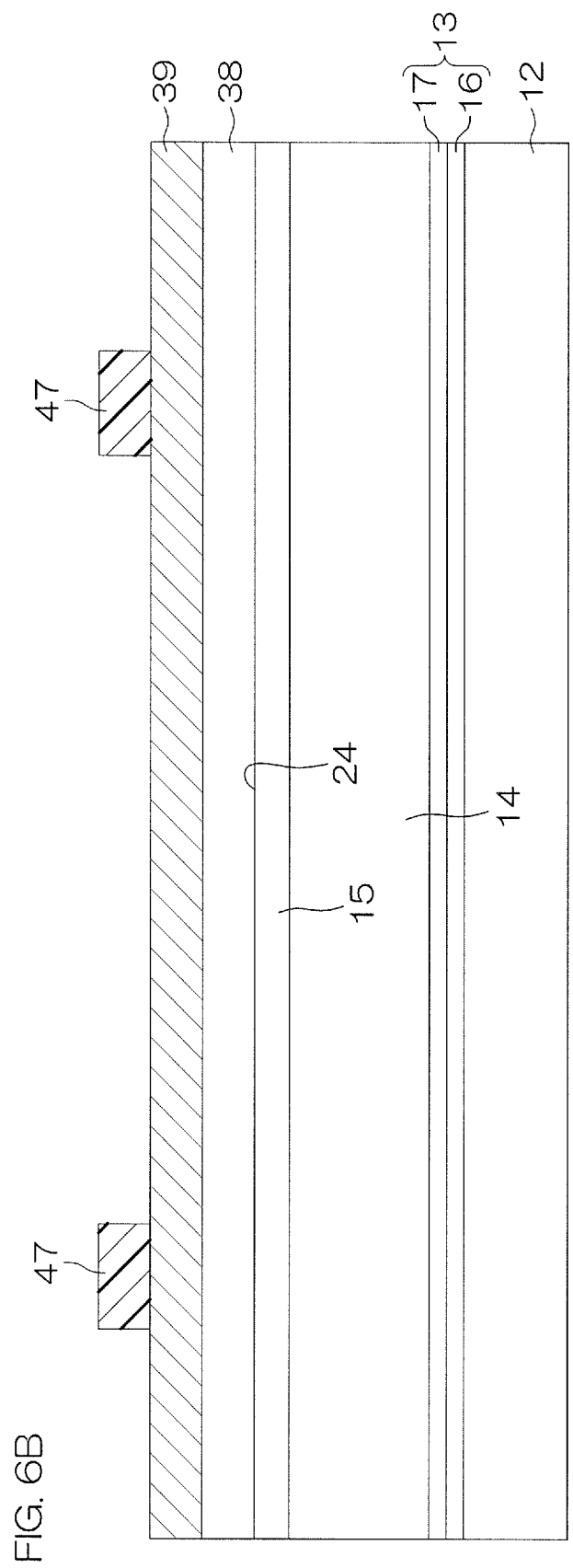

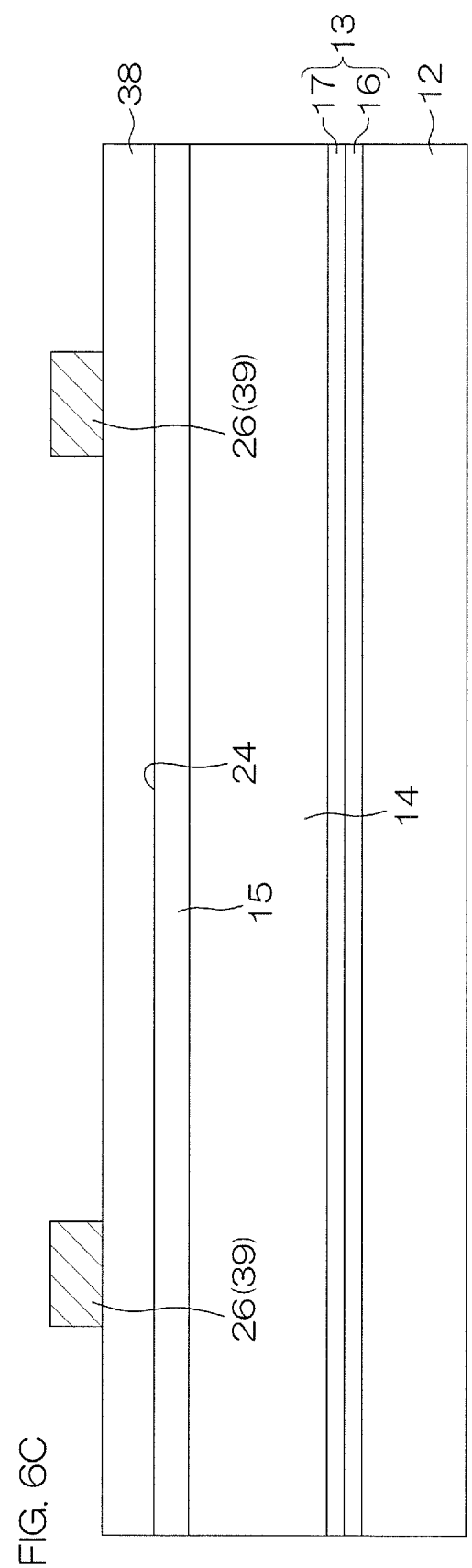

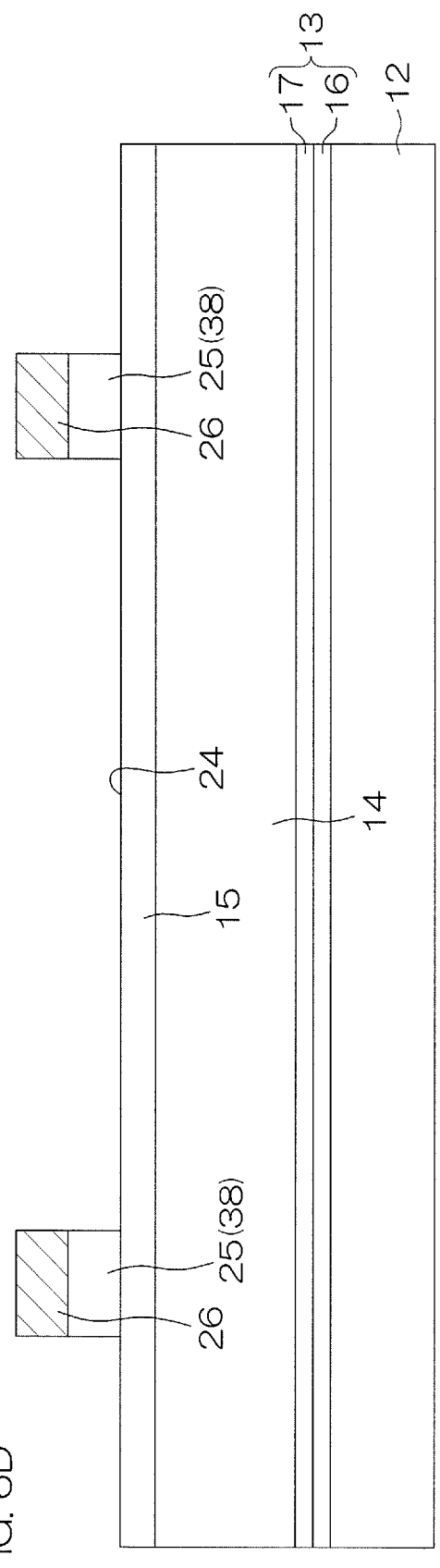

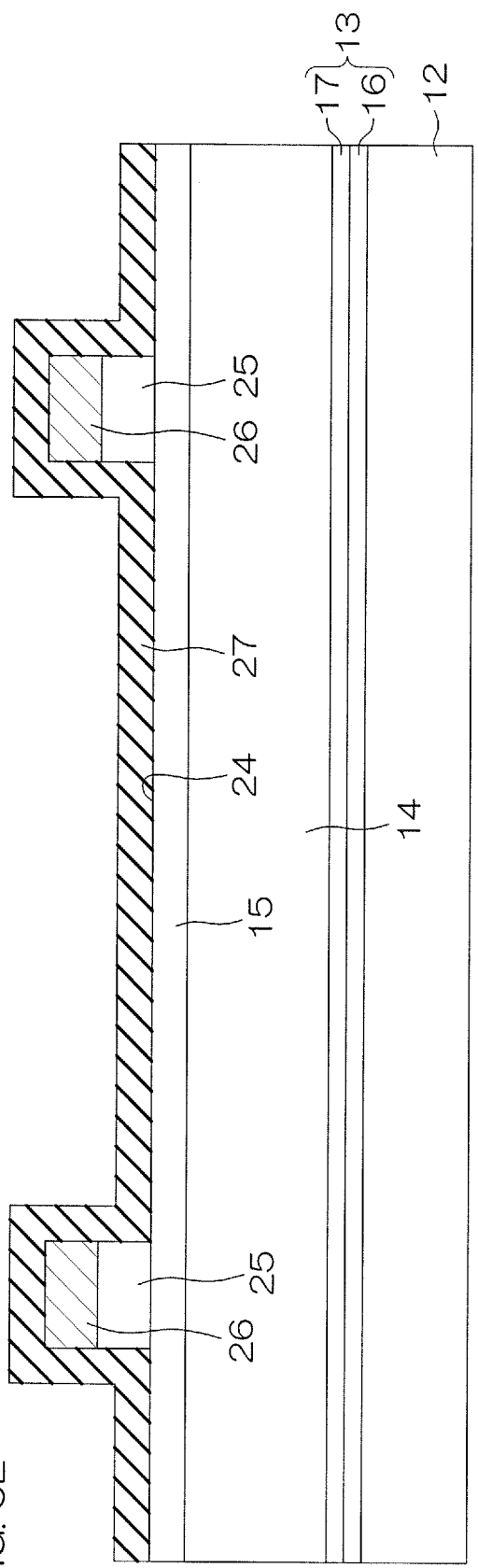

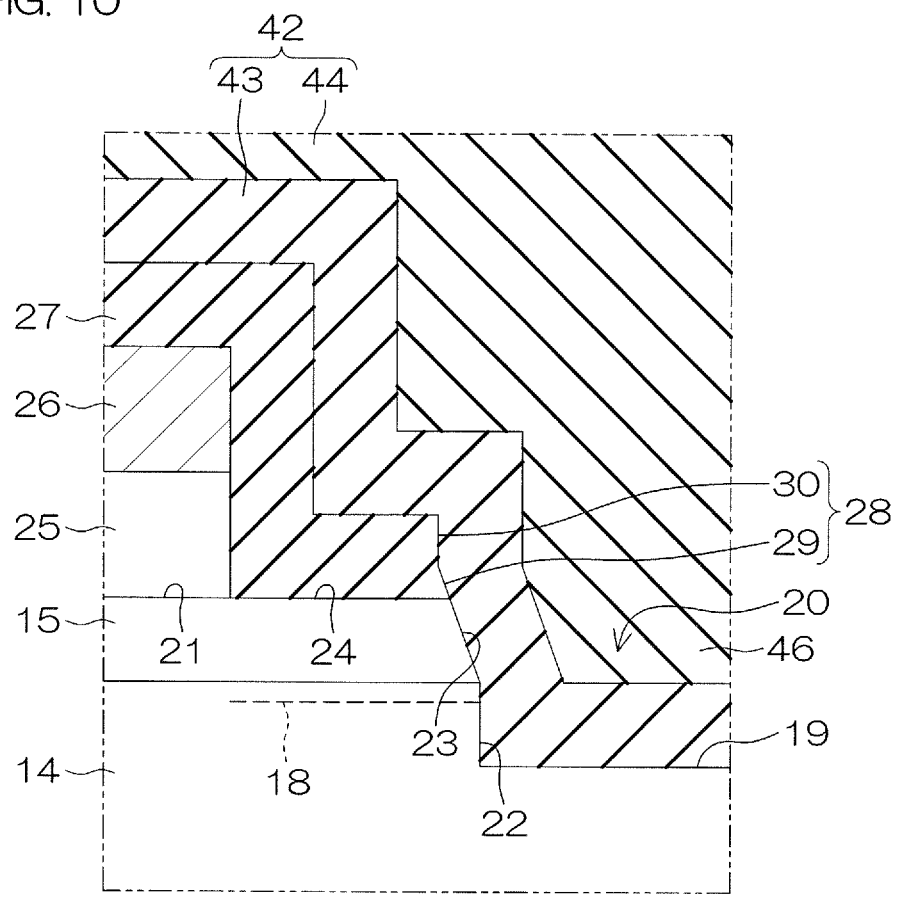

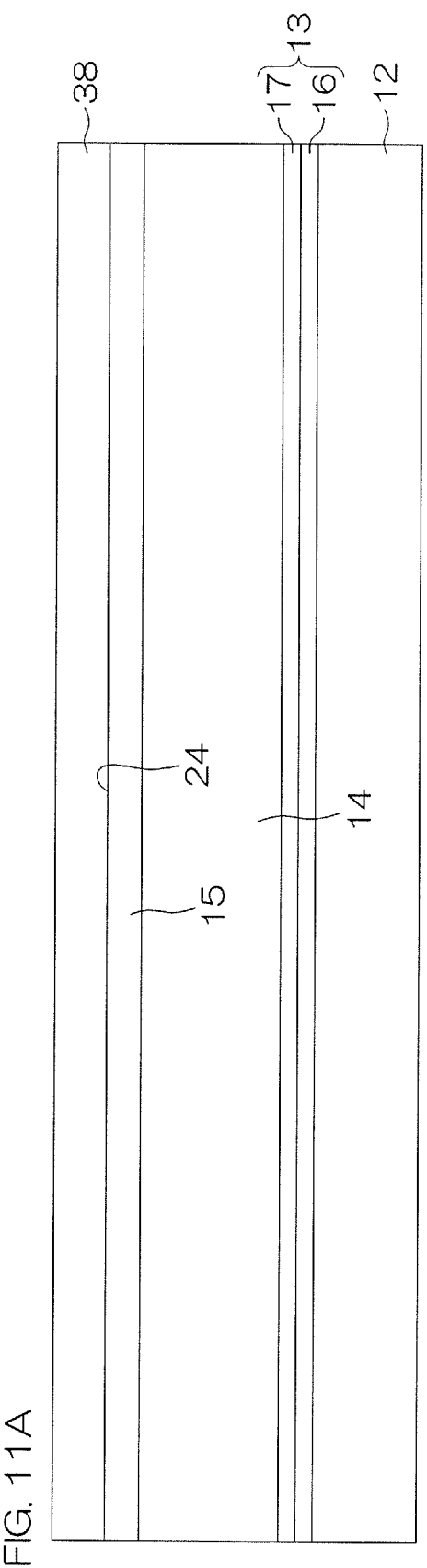

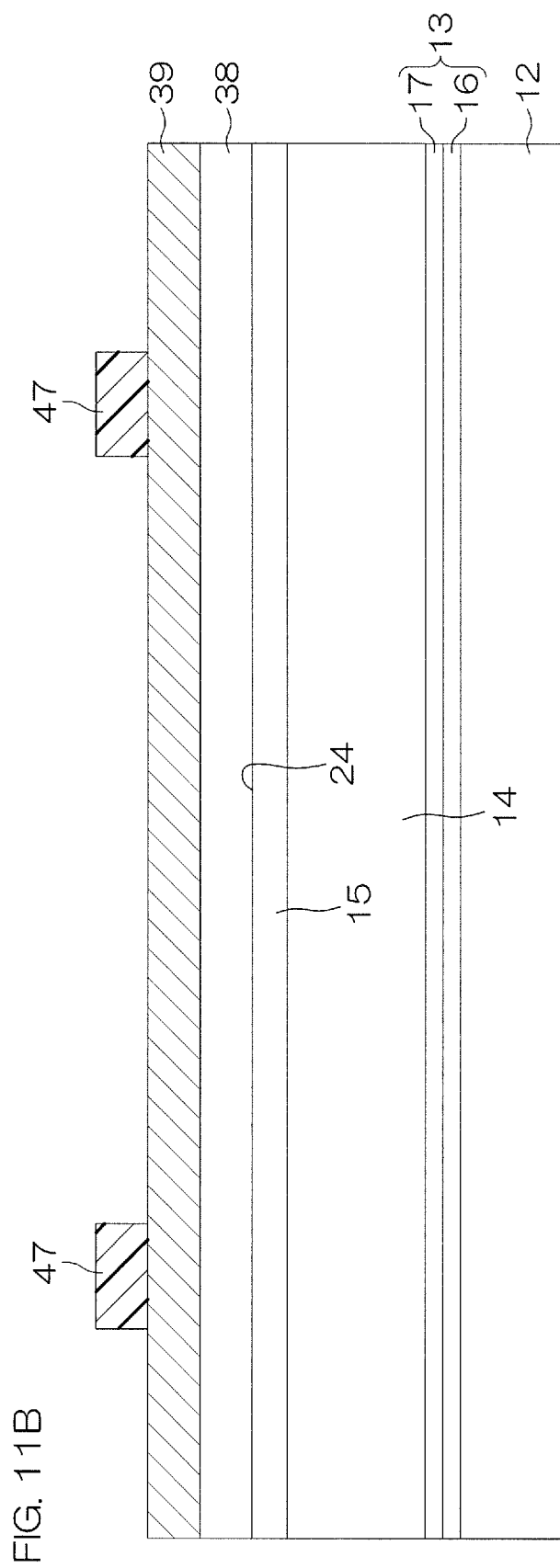

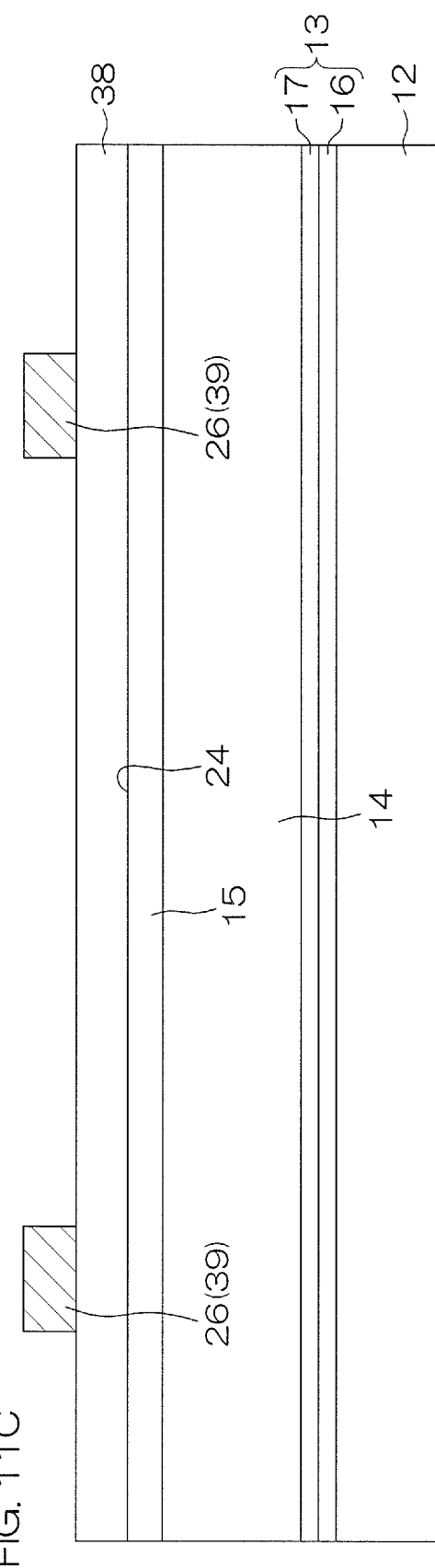

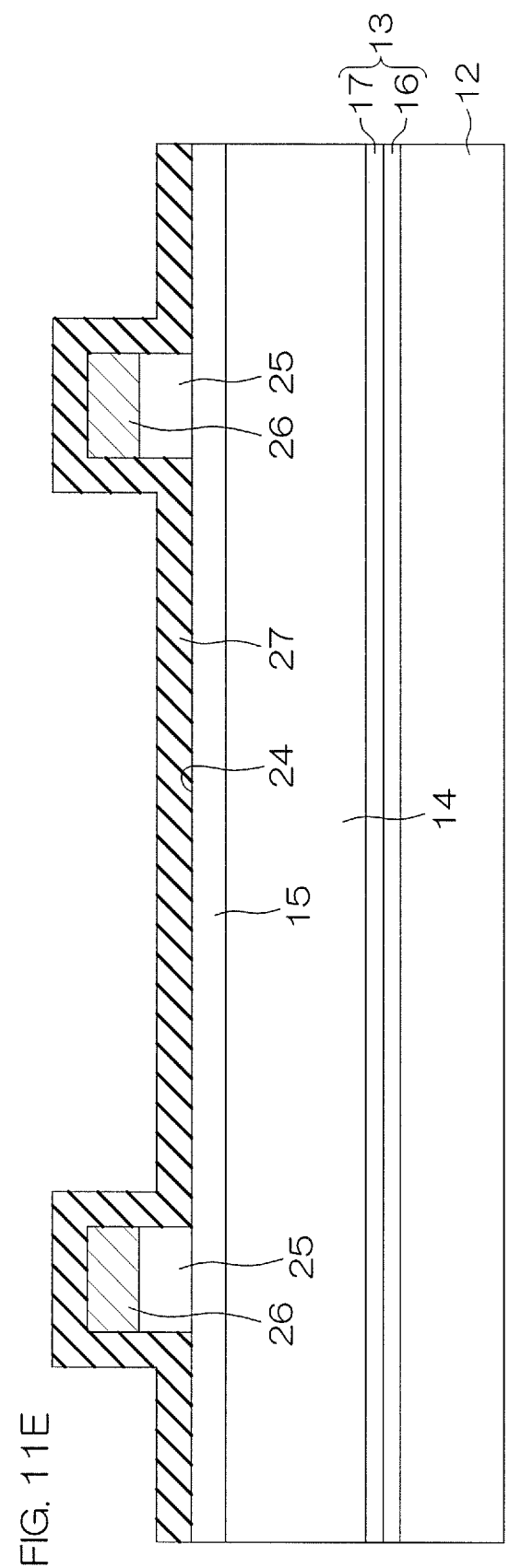

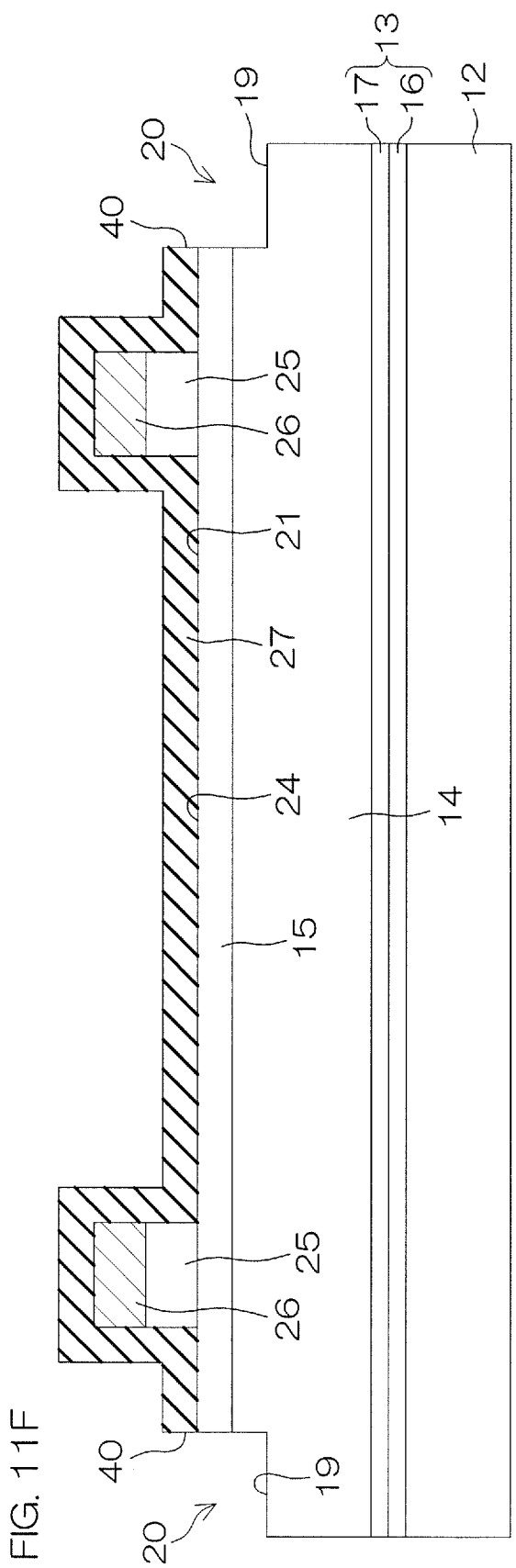

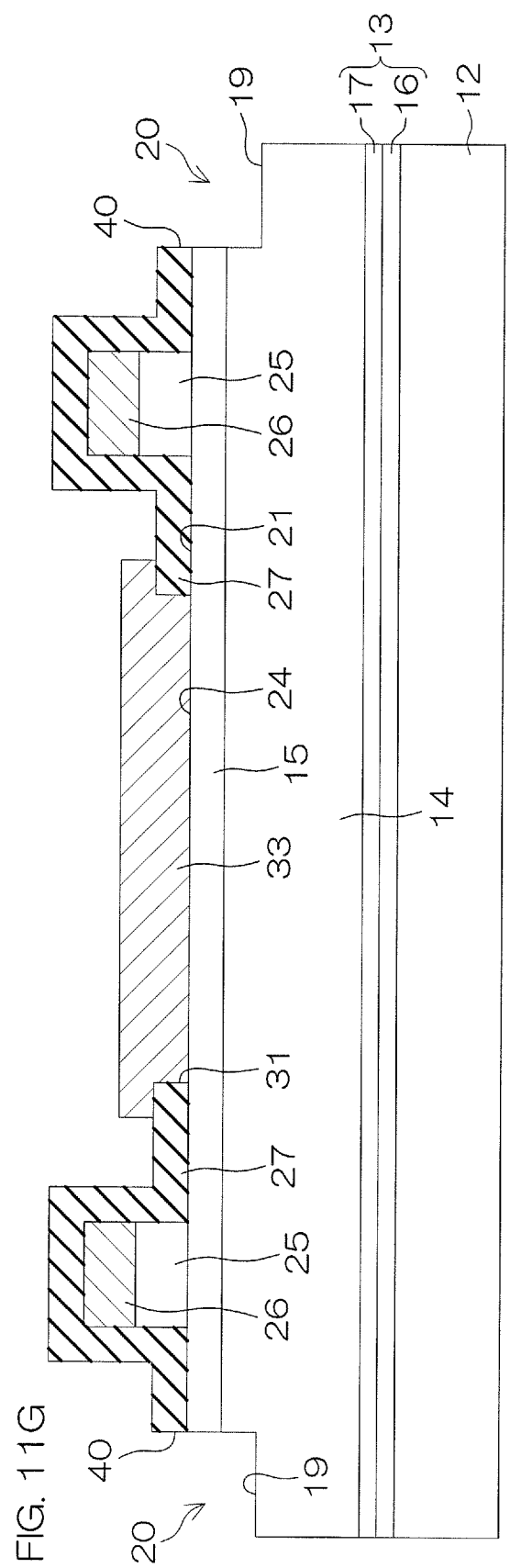

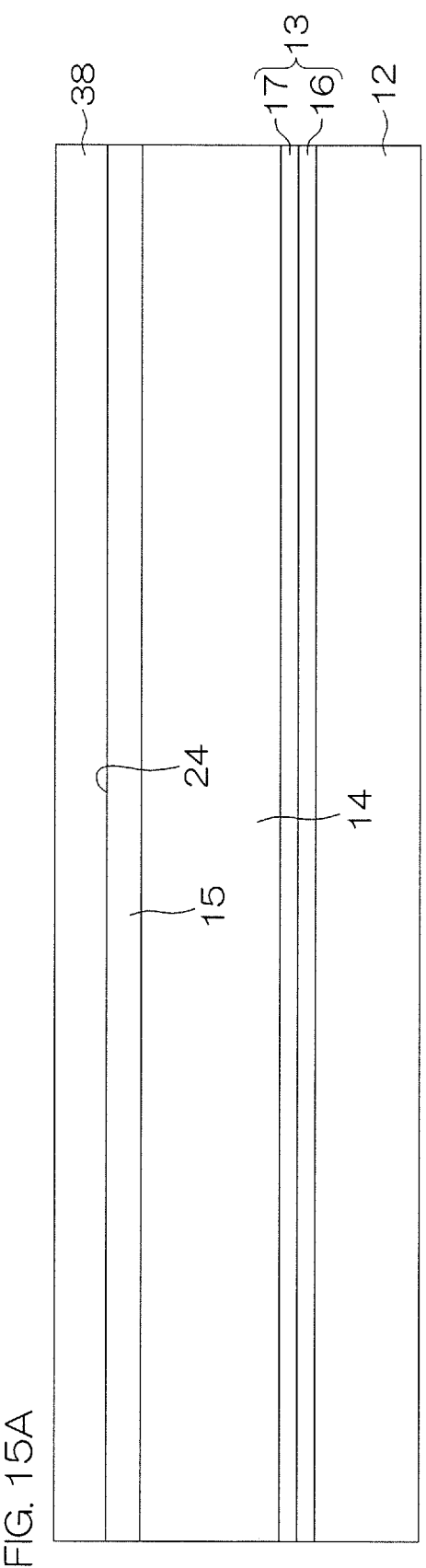

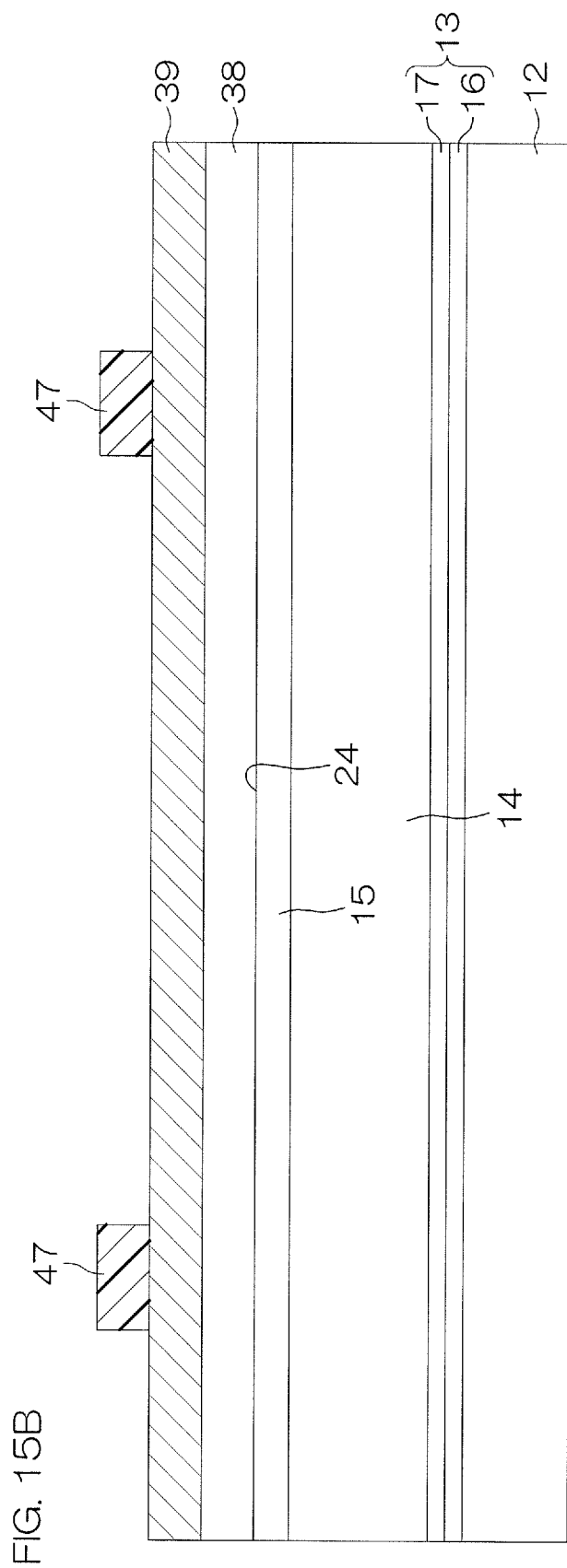

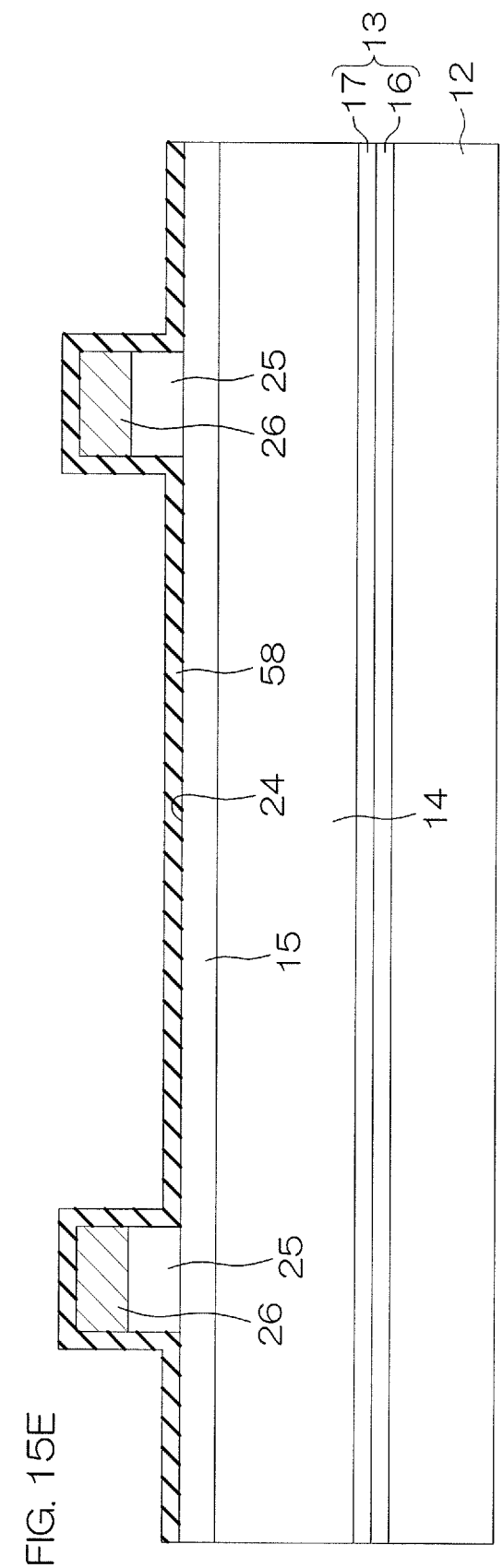

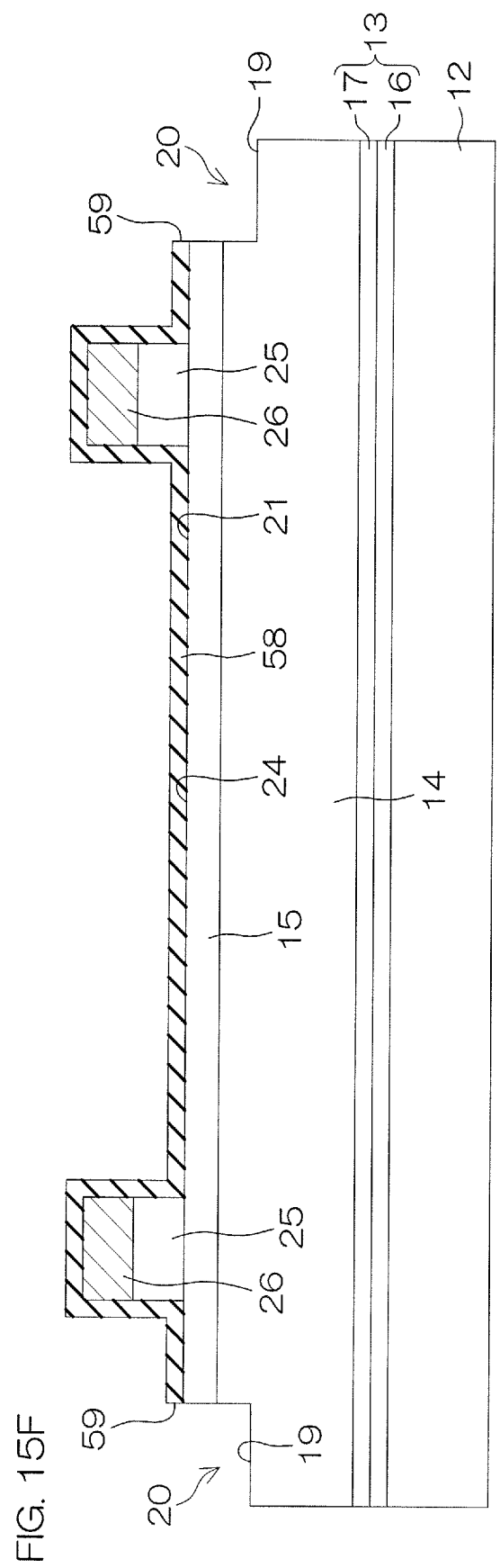

NITRIDE SEMICONDUCTOR DEVICE COMPRISING LAYERED STRUCTURE OF ACTIVE REGION AND METHOD FOR MANUFACTURING THE SAME

CROSS-REFERENCE TO RELATED APPLICATIONS

This application claims benefit of Japanese Patent Application No. 2018-190199, filed Oct. 5, 2018, entitled NITRIDE SEMICONDUCTOR DEVICE AND METHOD FOR MANUFACTURING NITRIDE SEMICONDUCTOR DEVICE, the specification of which is incorporated by reference herein in its entirety.

TECHNICAL FIELD

The present invention relates to a nitride semiconductor device that has a HEMT (High Electron Mobility Transistor) structure and a method for manufacturing the nitride semiconductor device.

BACKGROUND

For example, Patent Literature 1 (Japanese Patent Application Publication No. 2004-273486) discloses a transistor that is a heterojunction field effect type transistor made of a semiconductor including nitride formed on a substrate and that is composed of a channel layer positioned on the substrate, a barrier layer being in contact with the channel layer and positioned on the channel layer, and a gate electrode positioned on the barrier layer. In this transistor, a p type semiconductor layer that is a semiconductor including p type impurities is positioned between the gate electrode and the channel layer at least under the gate electrode.

In a process for manufacturing the transistor of Patent Literature 1, a semiconductor layer, a barrier layer made of non-doped $Al_{0.3}Ga_{0.7}N$, and a p type semiconductor film epitaxially grow in order from below by applying an epitaxial growth method, such as an MOCVD method or an MBE method, onto the substrate. Thereafter, a portion outside a region in which a transistor is produced is subjected to device isolation by means of etching.

SUMMARY

When a portion outside a transistor region is etched as in Patent Literature 1, the transistor region is protected by a mask, such as a photoresist. This kind of mask is an unnecessary constituent in a transistor that is a final product, and hence is removed by ashing after being subjected to etching.

However, a surface of the barrier layer is damaged by ashing, thus reaching a state in which a leakage current easily flows, for example, between a source/drain electrode formed on the resulting damaged surface and a gate electrode.

An object of the present invention is to provide a nitride semiconductor device that is capable of reducing damage that a surface of a barrier layer receives and that is capable of reducing a leakage current that flows through an interface between the surface of the barrier layer and an insulating film placed on the surface of the barrier layer, and is to provide a method for manufacturing the nitride semiconductor device.

BRIEF DESCRIPTION OF THE DRAWINGS

For a more complete understanding, reference is now made to the following description taken in conjunction with the accompanying Drawings in which:

FIG. 6A to FIG. 6G are views showing manufacturing steps of the nitride semiconductor device of FIG. 3 in a process sequence.

FIG. 10 is a cross-sectional view in which a main portion of the nitride semiconductor device is enlarged, showing a portion surrounded by an alternate long and two short dashed line X of FIG. 8.

FIG. 11A to FIG. 11H are views showing manufacturing steps of the nitride semiconductor device of FIG. 8 in a process sequence.

FIG. 15A to FIG. 15H are views showing manufacturing steps of the nitride semiconductor device of FIG. 12 in a process sequence.

DETAILED DESCRIPTION

Figure 1:
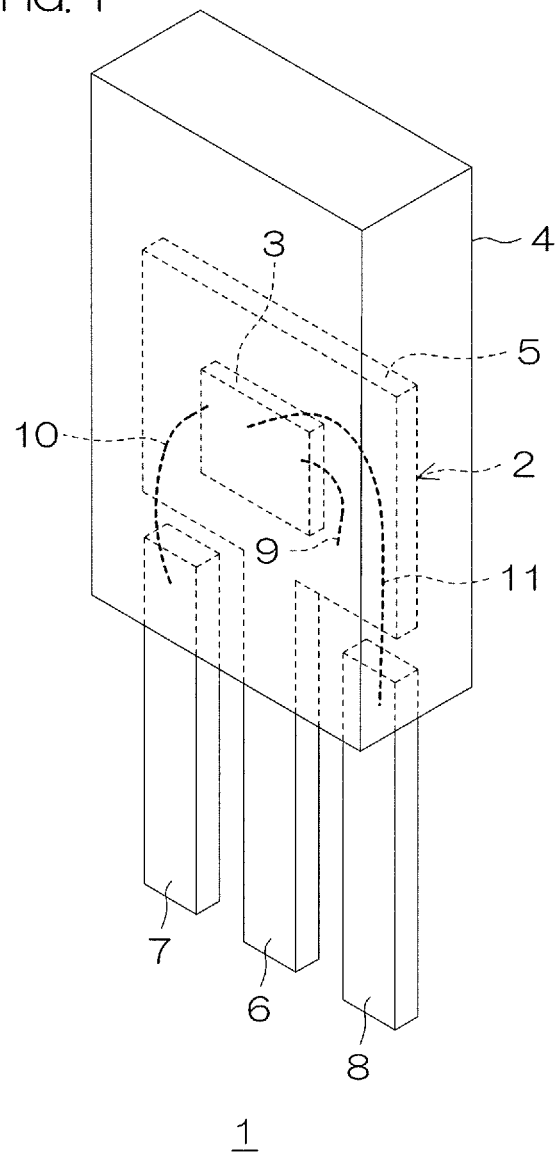
FIG. 1 is an external view of a semiconductor package including a nitride semiconductor device according to a preferred embodiment of the present invention.

A nitride semiconductor device according to one preferred embodiment of the present invention includes a channel layer made of a nitride semiconductor, a barrier layer that is formed on the channel layer and that is made of $Al_x In_y Ga_{1-x-y}N$ (x>0, x+y≤1), an active region that has a layered structure including the channel layer and the barrier layer, an inactive region that is formed at the layered structure around the active region and that is a concave portion having a bottom portion that reaches the channel layer, a gate layer that is selectively formed on the barrier layer in the active region and that is made of a nitride semiconductor, a gate electrode formed on the gate layer, a first insulating film that covers the gate electrode and that is in contact with the barrier layer in the active region, and a second insulating film that covers the first insulating film and that is in contact with the inactive region.

This nitride semiconductor device can be manufactured by a method for manufacturing a nitride semiconductor device according to one preferred embodiment of the present invention, and the method includes, for example, a step of forming a barrier layer made of $Al_xIn_yGa_{1-x-y}N$ (x>0, x+y≤1) on a channel layer made of a nitride semiconductor, a step of forming a first nitride semiconductor layer on the barrier layer, a step of selectively forming a gate electrode on the first nitride semiconductor layer, a step of forming a gate layer made of the first nitride semiconductor layer directly under the gate electrode by selectively removing a part of the first nitride semiconductor layer while using the gate electrode as a mask, a step of forming a first insulating film on the barrier layer so as to cover the gate electrode, a step of forming a first opening in the first insulating film by selectively removing a part of the first insulating film, a step of forming an inactive region that is a concave portion whose bottom portion reaches the channel layer by removing the barrier layer and the channel layer successively from the first opening while using the first insulating film as a mask, and a step of forming a second insulating film so as to be brought into contact with the inactive region and cover the first insulating film.

According to this method, the inactive region is formed by the removing step in which the first insulating film is used as a mask. The first insulating film is configured to remain as a part of the nitride semiconductor device that is a final product, and hence is not required to be removed by ashing after finishing the removing step. Additionally, when the gate layer is formed, the gate electrode that is not required to be removed by ashing is used as a mask instead of using a photoresist or the like as a mask. Therefore, in a continuous process flow to form the gate layer and the inactive region, it is possible to reduce damage that the surface of the barrier layer receives. As a result, it is possible to reduce a leakage current that flows through the interface between the surface of the barrier layer and the first insulating film on this surface.

In the nitride semiconductor device according to one preferred embodiment of the present invention, the second insulating film may be a single-layer film.

In the nitride semiconductor device according to one preferred embodiment of the present invention, the first insulating film may be a nitride film, and the second insulating film may be an oxide film.

In the nitride semiconductor device according to one preferred embodiment of the present invention, the second insulating film may be a multi-layer film.

In the nitride semiconductor device according to one preferred embodiment of the present invention, the first insulating film may be a nitride film, and the second insulating film may include a layered structure including a nitride film and an oxide film disposed on the nitride film.

The nitride semiconductor device according to one preferred embodiment of the present invention may include an ohmic electrode that is formed on the first insulating film, that is covered with the second insulating film, and that is ohmically connected to the barrier layer through the first insulating film.

In the nitride semiconductor device according to one preferred embodiment of the present invention, the ohmic electrode may include a source electrode and a drain electrode between which the gate electrode is placed.

A nitride semiconductor device according to one other preferred embodiment of the present invention includes a channel layer made of a nitride semiconductor, a barrier layer that is formed on the channel layer and that is made of $Al_xIn_yGa_{1-x-y}N$ (x>0, x+y≤1), an active region that has a layered structure including the channel layer and the barrier layer, an inactive region that is formed at the layered structure around the active region and that is a concave portion having a bottom portion that reaches the channel layer, a gate layer that is selectively formed on the barrier layer in the active region and that is made of a nitride semiconductor, a gate electrode formed on the gate layer, and a third insulating film that covers the gate electrode and that has a first portion being in contact with the barrier layer in the active region and a second portion being in contact with the inactive region, and, in the nitride semiconductor device, the first portion of the third insulating film has a thickness larger than a thickness of the second portion of the third insulating film.

This nitride semiconductor device can be manufactured by a method for manufacturing a nitride semiconductor device according to one other preferred embodiment of the present invention, and the method includes, for example, a step of forming a barrier layer made of $Al_xIn_yGa_{1-x-y}N$ (x>0, x+y≤1) on a channel layer made of a nitride semiconductor, a step of forming a first nitride semiconductor layer on the barrier layer, a step of selectively forming a gate electrode on the first nitride semiconductor layer, a step of forming a gate layer made of the first nitride semiconductor layer directly under the gate electrode by selectively removing a part of the first nitride semiconductor layer while using the gate electrode as a mask, a step of forming a fourth insulating film on the barrier layer so as to cover the gate electrode, a step of forming a second opening in the fourth insulating film by selectively removing a part of the fourth insulating film, a step of forming an inactive region that is a concave portion whose bottom portion reaches the channel layer by removing the barrier layer and the channel layer successively from the second opening while using the fourth insulating film as a mask, and a step of forming a fifth insulating film by use of the same material as the fourth insulating film so as to be brought into contact with the inactive region and cover the fourth insulating film.

According to this method, the inactive region is formed by the removing step in which the fourth insulating film is used as a mask. The fourth insulating film is configured to, together with the fifth insulating film, remain as the third insulating film of the nitride semiconductor device that is a final product, and hence is not required to be removed by ashing after finishing the removing step. Additionally, when the gate layer is formed, the gate electrode that is not required to be removed by ashing is used as a mask instead of using a photoresist or the like as a mask. Therefore, in a continuous process flow to form the gate layer and the inactive region, it is possible to reduce damage that the surface of the barrier layer receives. As a result, it is possible to reduce a leakage current that flows through the interface between the surface of the barrier layer and the third insulating film on this surface.

In the nitride semiconductor device according to one other preferred embodiment of the present invention, the third insulating film may be a nitride film.

In the nitride semiconductor device according to one other preferred embodiment of the present invention, the thickness of the second portion of the third insulating film may be 50 nm or less.

The nitride semiconductor device according to one other preferred embodiment of the present invention may include an ohmic electrode that is formed on the second portion of the third insulating film and that is ohmically connected to the barrier layer through the second portion of the third insulating film.

In the nitride semiconductor device according to one other preferred embodiment of the present invention, the ohmic electrode may include a source electrode and a drain electrode between which the gate electrode is placed.

In the nitride semiconductor device according to one other preferred embodiment of the present invention, the source electrode may include a field plate that extends such that the field plate covers the gate electrode, and the thickness of the first portion of the third insulating film may be 100 nm or more.

In the nitride semiconductor device according to one other preferred embodiment of the present invention, the gate layer may be formed in a self-aligned manner with respect to the gate electrode.

In the method for manufacturing a nitride semiconductor device according to one preferred embodiment of the present invention, the step of forming the second insulating film may include a step of forming a first film made of the same material as the first insulating film so as to be brought into contact with the inactive region and a step of forming a second film made of a different material from the material of the first insulating film on the first film.

The method for manufacturing a nitride semiconductor device according to one other preferred embodiment of the present invention may include a step of forming a sixth insulating film made of a different material from a material of the fifth insulating film so as to cover the fifth insulating film.

Preferred embodiment of the present invention will be hereinafter described in detail with reference to the accompanying drawings.

FIG. 1 is an external view of a semiconductor package 1 including a nitride semiconductor device 3 according to a preferred embodiment of the present invention.

The semiconductor package 1 includes a lead frame 2, the nitride semiconductor device 3 (chip), and a molding resin 4.

The lead frame 2 is metallic and tabular. The lead frame 2 includes a chip support portion 5 (island) that supports the nitride semiconductor device 3, a drain terminal 6, a source terminal 7, and a gate terminal 8. The drain terminal 6 is formed integrally with the chip support portion 5. The drain terminal 6, the source terminal 7, and the gate terminal 8 are electrically connected to a drain, a source, and a gate of the nitride semiconductor device 3 by means of bonding wires 9 to 11, respectively. The source terminal 7 and the gate terminal 8 are disposed so that the drain terminal 6 occupying a center is placed between the source terminal 7 and the gate terminal 8.

The molding resin 4 is made of a known molding resin, such as epoxy resin, and seals the nitride semiconductor device 3. The molding resin 4 covers the chip support portion 5 of the lead frame 2 and the bonding wires 9 to 11 together with the nitride semiconductor device 3. A part of the three terminals 6 to 8 is exposed from the molding resin 4.

Figure 2:
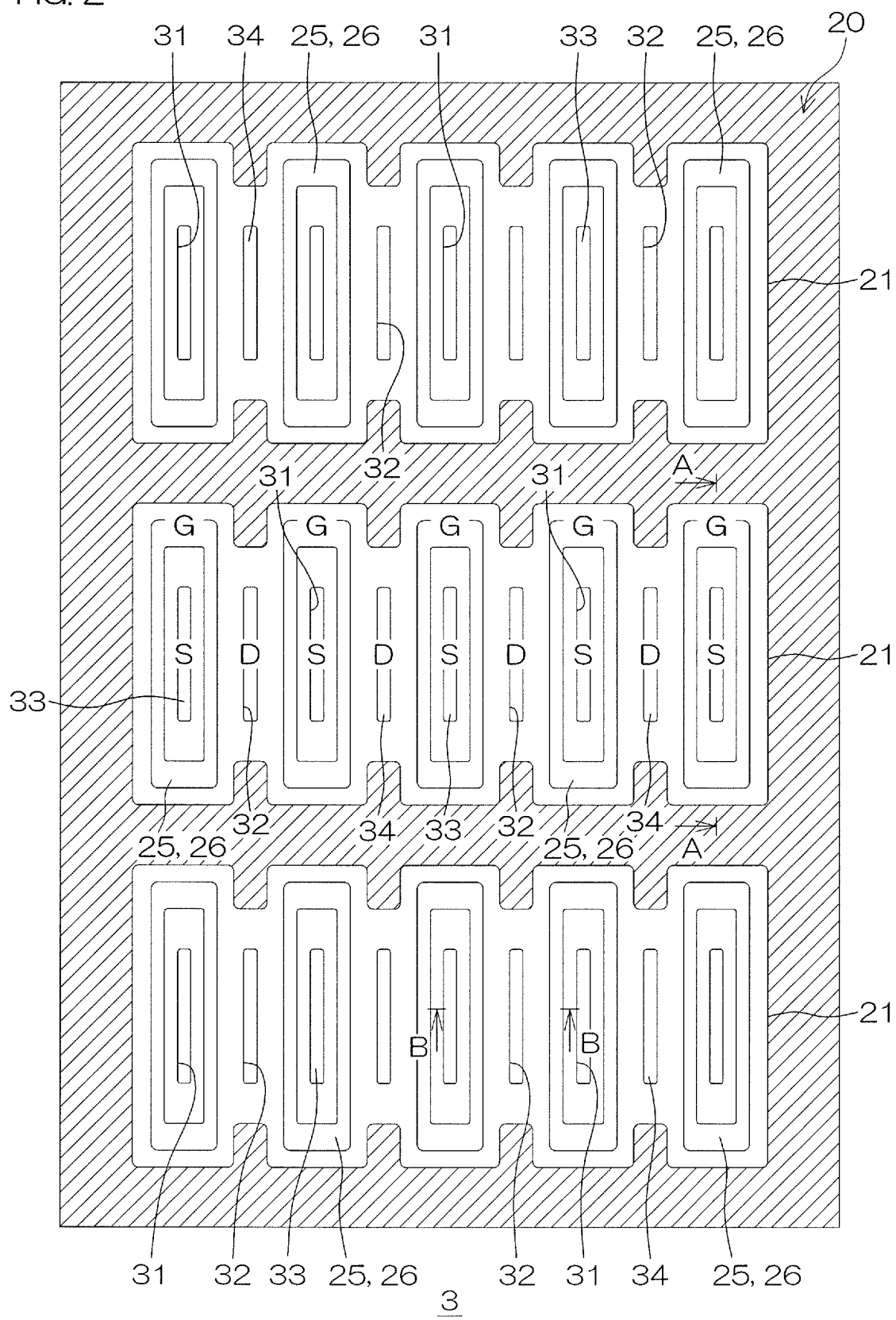
FIG. 2 is a schematic plan view in which a main portion of the nitride semiconductor device is enlarged.
Figure 3:
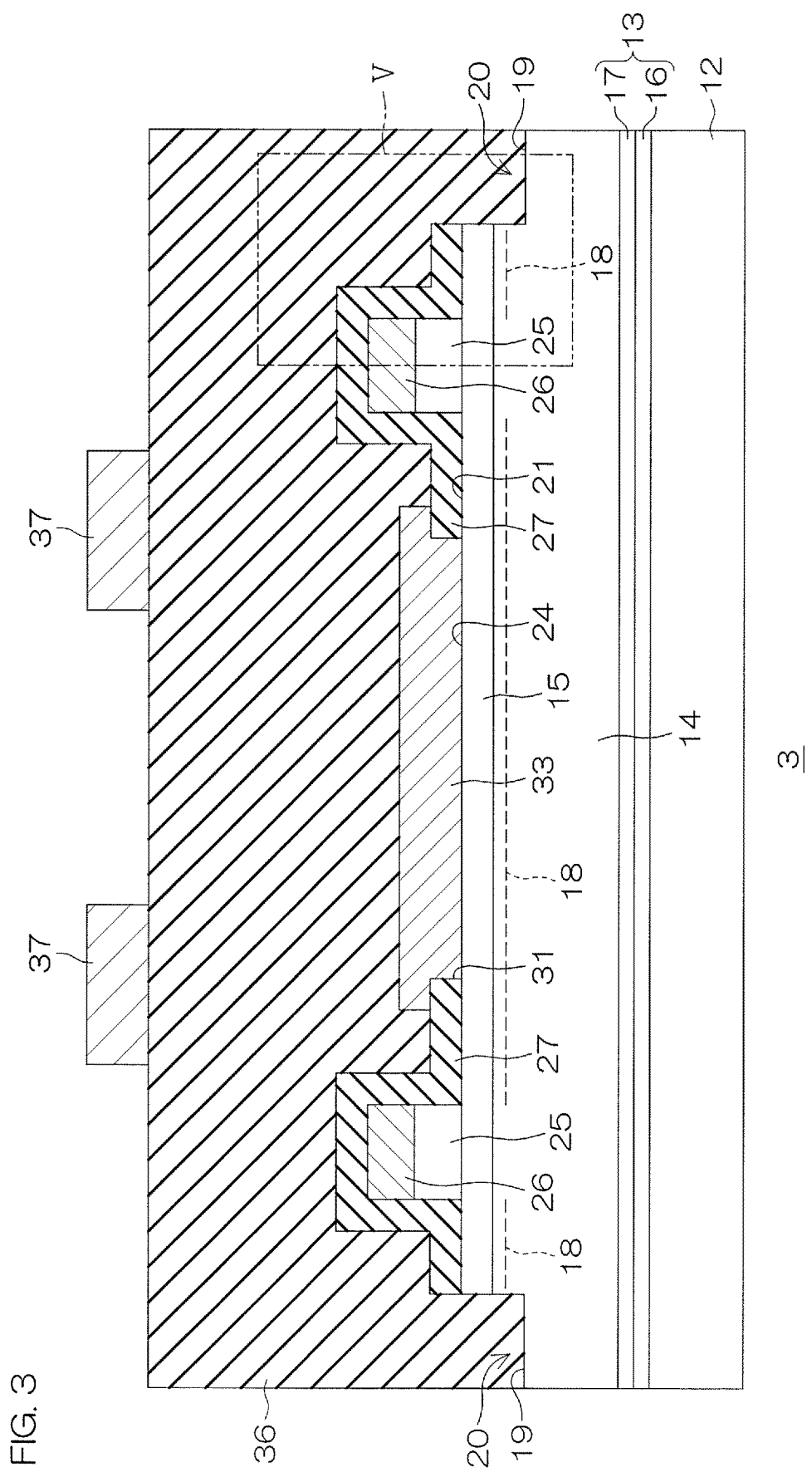
FIG. 3 is a cross-sectional view of the nitride semiconductor device, showing a cross section along line A-A of FIG. 2.
Figure 4:
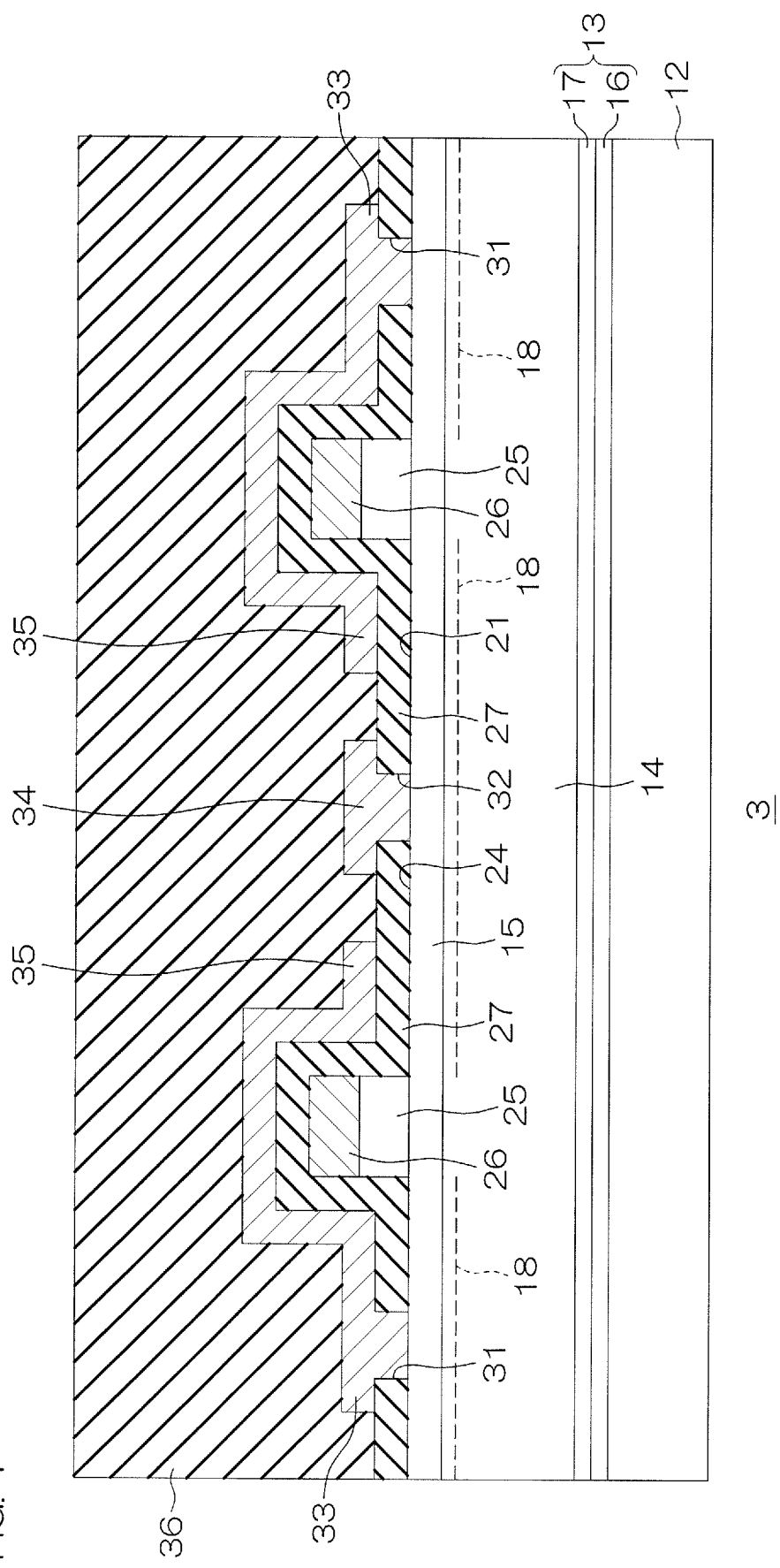
FIG. 4 is a cross-sectional view of the nitride semiconductor device, showing a cross section along line B-B of FIG. 2.
Figure 5:
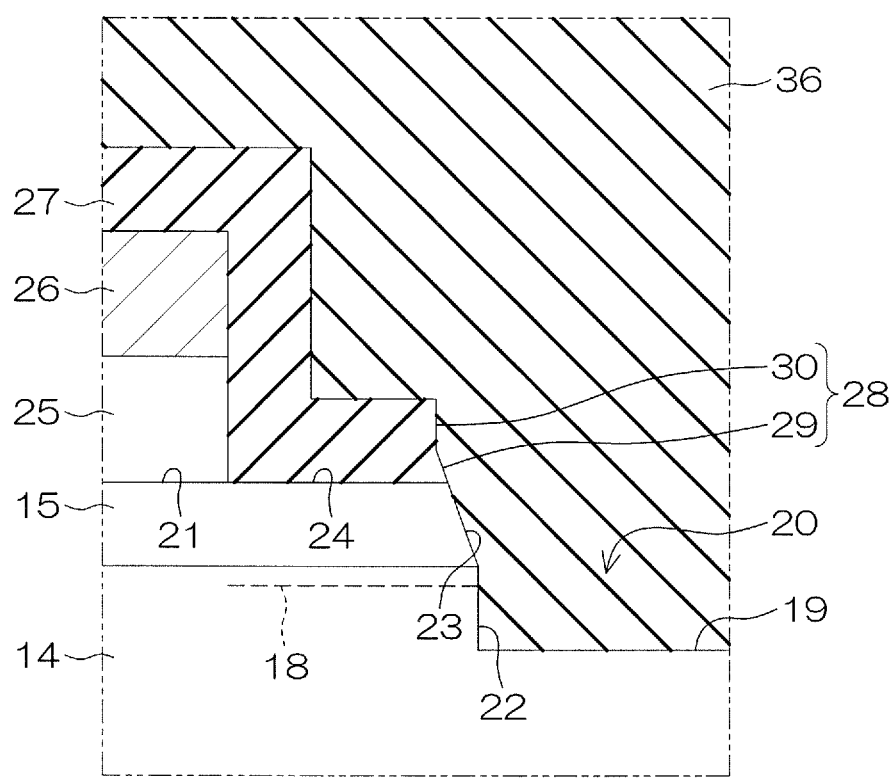
FIG. 5 is a cross-sectional view in which a main portion of the nitride semiconductor device is enlarged, showing a portion surrounded by an alternate long and two short dashed line V of FIG. 3.

FIG. 2 is a schematic plan view in which a main portion of the nitride semiconductor device 3 is enlarged. FIG. 3 is a cross-sectional view (first form) of the nitride semiconductor device 3, showing a cross section along line A-A of FIG. 2. FIG. 4 is a cross-sectional view of the nitride semiconductor device 3 (first form), showing a cross section along line B-B of FIG. 2. FIG. 5 is a cross-sectional view in which a main portion of the nitride semiconductor device 3 is enlarged, showing a portion surrounded by an alternate long and two short dashed line V of FIG. 3.

The nitride semiconductor device 3 includes a substrate 12, a buffer layer 13 laminated on the substrate 12, a channel layer 14 laminated on the buffer layer 13, and a barrier layer 15 laminated on the channel layer 14. The channel layer 14 and barrier layer 15 may alternatively be referred to as an electron transit layer 14 and an electron supply layer 15, respectively.

The substrate 12 may be, for example, a low-resistance silicon substrate that includes p type impurities. The low-resistance silicon substrate may have an impurity concentration of, for example, $1\times10^{17}$ cm$^{-3}$ to $1\times10^{20}$ cm$^{-3}$ (more specifically, about $1\times10^{18}$ cm$^{-3}$). Additionally, the substrate 12 may be a low-resistance GaN substrate, a low-resistance SiC substrate, a sapphire substrate, or the like besides the low-resistance silicon substrate.

The buffer layer 13 is a multi-layer buffer layer produced by laminating a plurality of nitride semiconductor layers together, and its film thicknesses may be about 0.2 μm. In the present preferred embodiment, the buffer layer 13 includes a first buffer layer 16 made of an AlN layer being in contact with a front surface of the substrate 12 and a second buffer layer 17 made of an AlGaN layer laminated on a surface (surface on the side opposite to the substrate 12) of the first buffer layer 16. The buffer layer 13 may be made of, for example, a single-layer film of AlN.

In the present preferred embodiment, the channel layer 14 is made of a GaN layer doped with an acceptor-type impurity, and its thickness may be about 1.0 μm. Preferably, the concentration of the acceptor-type impurity is $4\times10^{16}$ cm$^{-3}$ or more. In the present preferred embodiment, the acceptor-type impurity is C (carbon).

The barrier layer 15 is made of a nitride semiconductor that is larger in bandgap than the channel layer 14. In detail, the barrier layer 15 is made of a nitride semiconductor that is higher in Al composition than the channel layer 14. In the nitride semiconductor, the bandgap becomes larger in proportion to an increase in Al composition. In the present preferred embodiment, the barrier layer 15 is made of $Al_xIn_yGa_{1-x-y}N$ (x>0, x+y≤1), and its thickness may be about 10 nm. Preferably, the film thickness of the barrier layer 15 is 10 nm to 20 nm.

As thus described, the channel layer 14 and the barrier layer 15 are each made of a nitride semiconductor that differs from each other in bandgap (in Al composition), and lattice mismatch occurs therebetween. The energy level of a conduction band of the channel layer 14 in the interface between the channel layer 14 and the barrier layer 15 becomes lower than the Fermi level because of spontaneous polarization in the channel layer 14 and the barrier layer 15 and because of piezoelectric polarization that results from the lattice mismatch between the channel layer 14 and the barrier layer 15. Hence, a two-dimensional electron gas (2DEG) 18 spreads in a position close to the interface between the channel layer 14 and the barrier layer 15 (for example, a distance of about several Å from the interface).

An inactive region 20, which is a concave portion whose bottom portion 19 reaches a halfway point in the thickness direction of the channel layer 14, is selectively formed at a layered structure including the channel layer 14 and the barrier layer 15. A region in which the inactive region 20 is not formed in the layered structure is an active region 21 that functions as an element part (HEMT) of the nitride semiconductor device 3. In the present preferred embodiment, a plurality of island-shaped active regions 21 are formed on the substrate 12 as shown in FIG. 2, and the inactive region 20 is formed around the active regions 21 so as to surround the active regions 21 (shown by hatching in FIG. 2). No specific limitations are imposed on the depth of the inactive region 20 if the inactive region 20 is configured to be capable of physically dividing the two-dimensional electron gas 18 near the interface between the channel layer 14 and the barrier layer 15. For example, the inactive region 20 may have such a depth as to allow the bottom portion 19 to be placed at the buffer layer 13.

Additionally, the inactive region 20 may integrally have a first side portion 22 that uprises substantially perpendicularly from the bottom portion 19 and a second side portion 23 that is continuous with the first side portion 22 and that is tilted with respect to a surface 24 of the barrier layer 15 so as to lean against the active region 21 as shown in FIG. 5. In the present preferred embodiment, the channel layer 14 is exposed as the first side portion 22 of the inactive region 20, and the barrier layer 15 is exposed as the second side portion 23 of the inactive region 20.

The bottom portion 19 and the side portions 22 and 23 of the inactive region 20 may be referred to as a bottom surface and lateral surfaces of the inactive region 20, respectively, if there is a clear boundary by which the bottom surface and the lateral surfaces are distinguished from each other in an inner surface of the inactive region 20.

In the active region 21, a gate layer 25 is selectively formed on the barrier layer 15, and a gate electrode 26 is formed on the gate layer 25. The gate electrode 26 faces the barrier layer 15 with the gate layer 25 between the gate electrode 26 and the barrier layer 15. In the present preferred embodiment, the gate layer 25 is formed in a self-aligned manner with respect to the gate electrode 26. Here, the term "being formed in a self-aligned manner" may denote that the gate layer 25 and the gate electrode 26 are laminated together so as to have lateral surfaces that are flush with each other.

The layered structure including the gate layer 25 and the gate electrode 26 is formed annularly (in the present preferred embodiment, in a rectangularly annular shape) one by one in the active region 21 as shown in FIG. 2. In one active region 21, for example, a plurality of annular layered structures each of which includes the gate layer 25 and the gate electrode 26 are disposed with intervals between the layered structures.

The gate layer 25 is made of a nitride semiconductor doped with acceptor-type impurities. In the present preferred embodiment, the gate layer 25 is made of a GaN layer (p type GaN layer) doped with an acceptor-type impurity, and its thickness is about 60 nm. Preferably, the concentration of the acceptor-type impurity is $3 \times 10^{17}$ cm$^{-3}$ or more. In the present preferred embodiment, the acceptor-type impurity is Mg (magnesium). The acceptor-type impurity may be an acceptor-type impurity, such as C (carbon), besides Mg. The gate layer 25 is provided to offset a two-dimensional electron gas 18 generated in the interface between the channel layer 14 and the barrier layer 15 in a region directly under the gate layer 25.

The gate electrode 26 is in contact with the gate layer 25. The gate electrode 26 is made of a TiN layer in the present preferred embodiment, and its thickness is about 100 nm.

A passivation film 27 that is an example of a first insulating film of the present invention is formed in the active region 21 so as to cover the gate electrode 26 and the gate layer 25. More specifically, the passivation film 27 covers the layered structure including the gate layer 25 and the gate electrode 26 so as to become contiguous to an upper surface and a lateral surface of this layered structure as shown in FIG. 3 and FIG. 4, and the passivation film 27 is in contact with the surface 24 of the barrier layer 15 in the active region 21.

Additionally, as shown in FIG. 5, the passivation film 27 is continuous with the side portion (in the present preferred embodiment, the second side portion 23) of the inactive region 20 without protruding from a boundary portion between the active region 21 and the inactive region 20, and has an end surface 28 that is flush with the second side portion 23. The end surface 28 of the passivation film 27 may integrally have a first portion 29 that is continuous with the second side portion 23 of the inactive region 20 and that is tilted with respect to the surface 24 of the barrier layer 15 and a second portion 30 that is continuous with the first portion 29 and that is perpendicular to the surface 24 of the barrier layer 15 as shown in FIG. 5. Hence, a portion (in the present preferred embodiment, the second portion 30) of the end surface 28 of the passivation film 27 may be disposed in a region that enters the active layer side with respect to the boundary portion between the active region 21 and the inactive region 20.

Additionally, the passivation film 27 is made of a single-layer film of a nitride film (for example, SiN film) in the present preferred embodiment, and its thickness may be 90 nm to 110 nm.

A source contact hole 31 and a drain contact hole 32 are selectively formed in the passivation film 27. As shown in FIG. 2, the source contact hole 31 is formed in an inner region of the gate electrode 26 that is annular in a plan view, and is formed linearly extending in a direction along a long side of the gate electrode 26 in the present preferred embodiment. Additionally, the drain contact hole 32 is formed in a region between the gate electrodes 26 that adjoin each other, and is formed linearly extending in the direction along the long side of the gate electrode 26 in the present preferred embodiment. Hence, in the active region 21, the source contact hole 31 and the drain contact hole 32 are alternately arranged, and are formed in a stripe shape as a whole. The gate electrode 26 is disposed between the source contact hole 31 and the drain contact hole 32.

A source electrode 33 and a drain electrode 34 each of which is an example of an ohmic electrode of the present invention are formed on the passivation film 27. In the active region 21, the source electrode 33 and the drain electrode 34 are alternately arranged, and are formed in a stripe shape as a whole. A gate electrode 26 is disposed between the source electrode 33 and the drain electrode 34 in such a manner as to be sandwiched between these electrodes.

The source electrode 33 is ohmically connected to the barrier layer 15 through the source contact hole 31. The source electrode 33 is, for example, an ohmic electrode that includes Ti and Al, and is electrically connected to the two-dimensional electron gas 18.

The source electrode 33 may have a field plate 35 (which is omitted in FIG. 2) that extends so as to cover the gate electrode 26 as shown in FIG. 4. The field plate 35 passes above the gate electrode 26 from an inner region of the gate electrode 26, and extends to the lateral side of the drain electrode 34. Therefore, each of the drain electrodes 34 is interposed between the field plates 35 that extend from the source electrodes 33 adjoining each drain electrode 34. In a region between mutually adjoining gate electrodes 26, the field plate 35 faces the barrier layer 15 and the two-dimensional electron gas 18 with the passivation film 27 between the field plate 35 and the barrier layer 15 and between the field plate 35 and the two-dimensional electron gas 18.

The drain electrode 34 is ohmically connected to the barrier layer 15 through the drain contact hole 32. The drain electrode 34 is, for example, an ohmic electrode that includes Ti and Al, and is electrically connected to the two-dimensional electron gas 18.

The bonding wires 9 to 11 shown in FIG. 1 are electrically connected to the drain electrode 34, the source electrode 33, and the gate electrode 26, respectively. A rear-surface electrode (not shown) is formed on a rear surface of the substrate 12. The substrate 12 is connected to the chip support portion 5 through the rear-surface electrode. Therefore, in the present preferred embodiment, the substrate 12 is electrically connected to the drain electrode 34 through the bonding wire 9, and is brought into a drain potential.

An interlayer insulating film 36 that is an example of a second insulating film of the present invention is formed so as to cover the passivation film 27. The interlayer insulating film 36 covers the passivation film 27, and further covers the source electrode 33, the drain electrode 34, and the field plate 35. As shown in FIG. 3, the interlayer insulating film 36 enters the inactive region 20 that is a concave portion, and comes into contact with the bottom portion 19 and with the side portions 22 and 23 (see FIG. 5) of the inactive region 20. Therefore, a boundary between the barrier layer 15 and the passivation film 27 is covered with the interlayer insulating film 36.

The interlayer insulating film 36 is made of a single-layer film of an oxide film (for example, SiO2 film) in the present preferred embodiment, and its thickness may be 0.8 µm to 1.2 µm.

A plurality of wires 37 are formed on the interlayer insulating film 36 as shown in FIG. 3. The plurality of wires 37 may be electrically connected to, for example, the drain electrode 34, the source electrode 33, and the gate electrode 26.

In the nitride semiconductor device 3, the barrier layer 15 that differs in bandgap (Al composition) from the channel layer 14 is formed on the channel layer 14 as described above, thus forming a heterojunction. Hence, a two-dimensional electron gas 18 is formed in the channel layer 14 near the interface between the channel layer 14 and the barrier layer 15, and an HEMT that uses the two-dimensional electron gas 18 as a channel is formed.

The gate electrode 26 faces the barrier layer 15 with the gate layer 25 made of a p type GaN layer between the gate electrode 26 and the barrier layer 15. Below the gate electrode 26, the energy level of the channel layer 14 and the energy level of the barrier layer 15 are raised by an ionized acceptor included in the gate layer 25 made of a p type GaN layer, and therefore the energy level of a conduction band in a heterojunction interface becomes higher than the Fermi level. Therefore, directly under the gate electrode 26, the two-dimensional electron gas 18, which results from spontaneous polarization in the channel layer 14 and the barrier layer 15 and from piezoelectric polarization caused by the lattice mismatch between the channel layer 14 and the barrier layer 15, is not formed. Therefore, when a bias is not applied to the gate electrode 26 (when a zero bias is applied to the gate electrode 26), the channel by the two-dimensional electron gas 18 is shut off directly under the gate electrode 26. A normally-off-type HEMT is realized in this way. When an appropriate ON-state voltage (for example, 3 V) is applied to the gate electrode 26, a channel is induced in the channel layer 14 directly under the gate electrode 26, and the two-dimensional electron gases 18 on both sides of the gate electrode 26 are connected together. Hence, an electric current is passed through a source-to-drain path.

When used, a predetermined voltage in which the drain-electrode-34 side becomes positive (for example, 200 V to 300 V) is applied, for example, between the source electrode 33 and the drain electrode 34. In this state, an OFF-state voltage (0 V) or an ON-state voltage (3 V) is applied to the gate electrode 26 under the condition that the source electrode 33 is in a reference potential (0 V).

FIG. 6A to FIG. 6G are views showing manufacturing steps of the aforementioned nitride semiconductor device 3 in a process sequence.

Figure 6A:
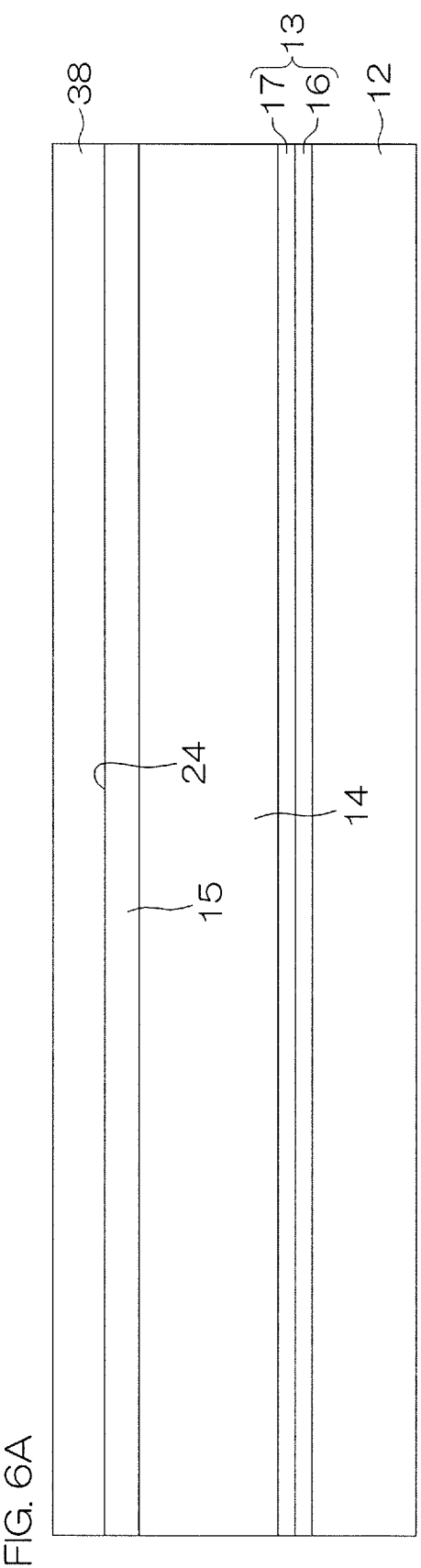

In order to manufacture the nitride semiconductor device 3, the buffer layer 13, the channel layer 14, the barrier layer 15, and a first nitride semiconductor layer 38 are formed on the substrate 12 according to, for example, an epitaxial growth method as shown in FIG. 6A. The first nitride semiconductor layer 38 is made of a nitride semiconductor doped with acceptor-type impurities, and, in the present preferred embodiment, is made of the same material as the gate layer 25.

Thereafter, as shown in FIG. 6B, an electrode material film 39 is formed on the first nitride semiconductor layer 38 according to, for example, a sputtering method. The electrode material film 39 is made of a TiN layer, and, in the present preferred embodiment, is made of the same material as the gate electrode 26. Thereafter, a mask 47 is selectively formed on the electrode material film 39. The mask 47 may be made of, for example, a known mask such as a photoresist.

Thereafter, as shown in FIG. 6C, the electrode material film 39 exposed from the mask 47 is selectively removed by etching (for example, dry etching) through the mask 47. Hence, a part of the electrode material film 39 covered with the mask 47 is formed as the gate electrode 26. Thereafter, the mask 47 is removed by ashing or the like.

Thereafter, as shown in FIG. 6D, the first nitride semiconductor layer 38 exposed from the gate electrode 26 is selectively removed by etching (for example, dry etching) in which the gate electrode 26 is used as a mask. Hence, a part of the first nitride semiconductor layer 38 covered with the gate electrode 26 is formed as the gate layer 25 that is self-aligning with respect to the gate electrode 26.

Thereafter, as shown in FIG. 6E, the passivation film 27 is formed on the entirety of the surface 24 of the barrier layer 15 so as to cover the gate electrode 26 according to, for example, a CVD method.

Figure 6F:
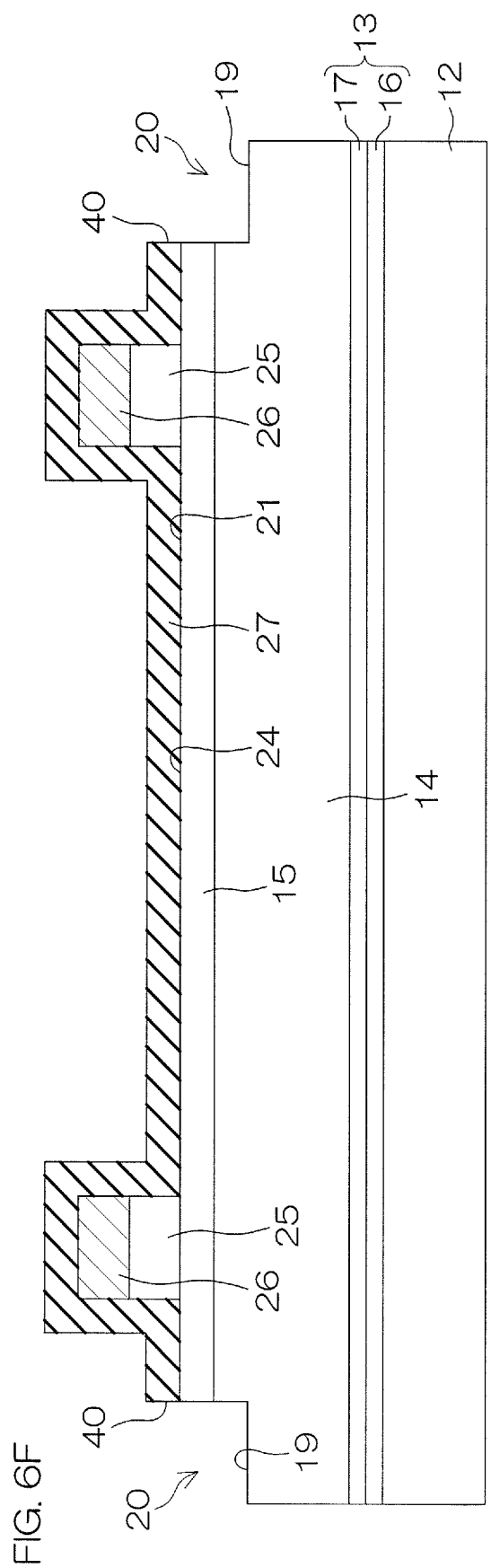

Thereafter, as shown in FIG. 6F, the passivation film 27 is selectively removed by, for example, etching (for example, dry etching), and, as a result, a first opening 40 is formed in the passivation film 27. The first opening 40 exposes a part of the barrier layer 15 at which the inactive region 20 is to be formed. Thereafter, the barrier layer 15 and the channel layer 14 are removed successively by means of etching (for example, dry etching) in which the passivation film 27 having the first opening 40 is used as a mask. Hence, the inactive region 20, which is formed in the shape of a concave portion by means of etching, is formed, and the active region 21 is formed in a region covered with the passivation film 27.

Figure 6G:
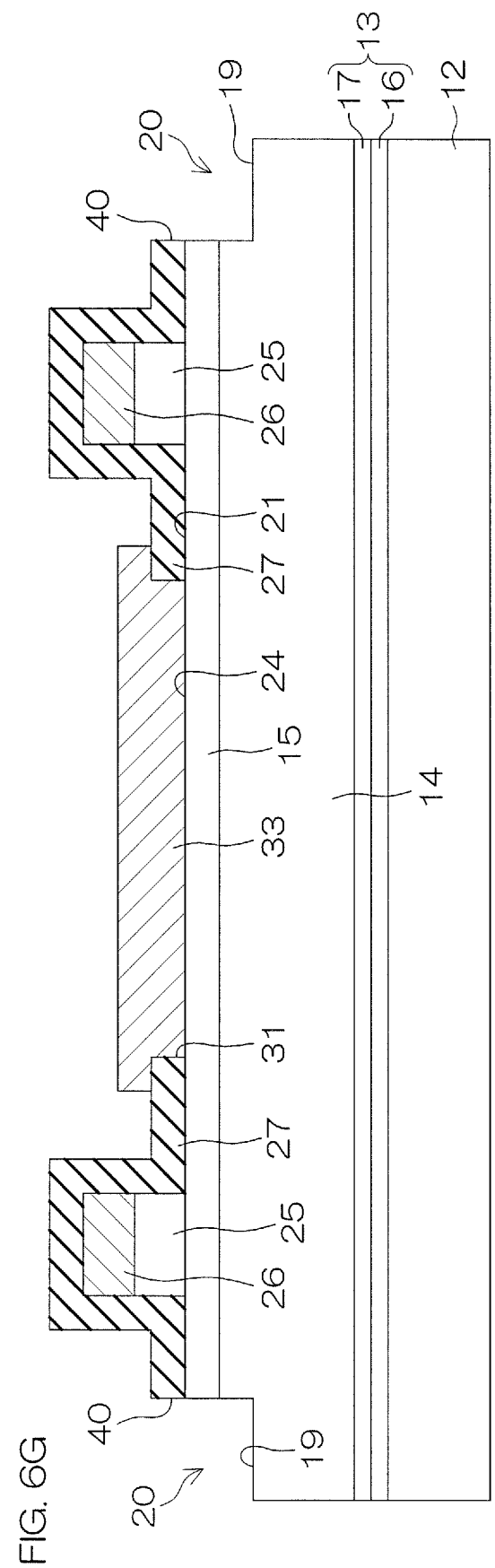

Thereafter, as shown in FIG. 6G, the passivation film 27 that has remained on the active region 21 is selectively removed by, for example, etching (for example, dry etching), and, as a result, a source contact hole 31 and a drain contact hole 32 (see FIG. 4) are simultaneously formed. Thereafter, an electrode material film (not shown) is formed on the entirety of the surface of the passivation film 27 according to, for example, the sputtering method. Thereafter, this electrode material film is selectively removed, and, as a result, the source electrode 33 and the drain electrode 34 (see FIG. 4) that are ohmically connected to the barrier layer 15 are formed.

Thereafter, as shown in FIG. 3, the interlayer insulating film 36 is formed in the entirety of the region on the substrate 12 according to, for example, the CVD method. The interlayer insulating film 36 covers the passivation film 27 on the active region 21, and enters the inactive region 20, and comes into contact with the bottom portion 19 and the side portions 22 and 23 of the inactive region 20. Thereafter, the wire 37 is selectively formed on the interlayer insulating film 36, and, as a result, the aforementioned nitride semiconductor device 3 is obtained.

According to the aforementioned method, the inactive region 20 is formed by the removing step in which the passivation film 27 is used as a mask as shown in FIG. 6F. The passivation film 27 is configured to remain as a part of the nitride semiconductor device 3 that is a final product (see FIG. 3 and FIG. 4), and hence is not required to be removed by ashing after finishing the removing step. Additionally, when the gate layer 25 is formed, the gate electrode 26 that is not required to be removed by ashing is used as a mask instead of using a photoresist or the like as a mask as shown in FIG. 6D. Therefore, in a continuous process flow to form the gate layer 25 and the inactive region 20, it is possible to reduce damage that the surface 24 of the barrier layer 15 receives. As a result, it is possible to reduce a leakage current that flows through the interface between the surface 24 of the barrier layer 15 and the passivation film 27 on the surface 24.

Figure 7:
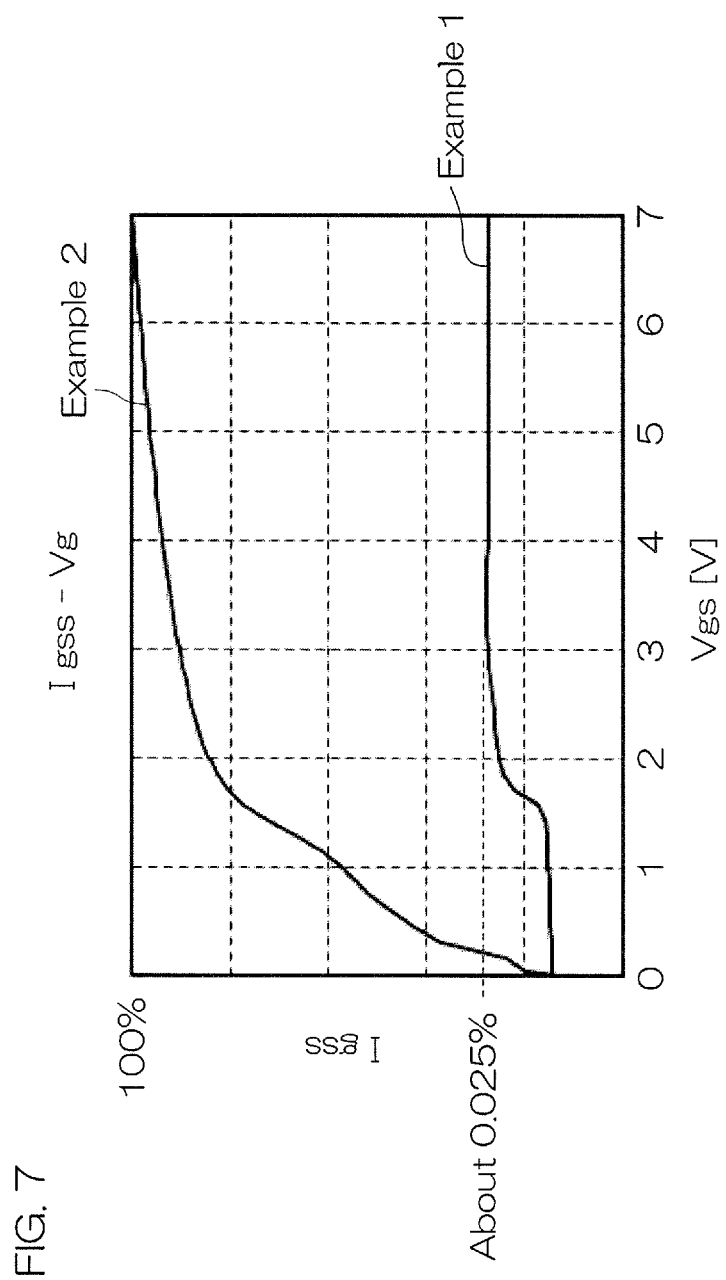
FIG. 7 is a simulation result showing an amount of leakage current.

This effect can be described by, for example, FIG. 7. FIG. 7 is a simulation result showing an amount of leakage current.

In the simulation of FIG. 7, mutually different interface state densities were set in the interface (AlGaN/SiN interface) between the barrier layer 15 and the passivation film 27 of a gate-to-source path, and were taken as Example 1 and Example 2, respectively. In Example 1, an interface state density, which is estimated in the AlGaN/SiN interface of the nitride semiconductor device 3 produced in accordance with the steps of FIG. 6A to FIG. 6G mentioned above, was set.

On the other hand, in Example 2, the gate layer 25 and the inactive region 20 were formed by etching in which a photoresist is used as a mask, which is a difference from Example 1. In other words, in Example 2, the photoresist is required to be removed by ashing after forming the gate layer 25 and the inactive region 20, and therefore an interface state density on the supposition that ashing damage is received two times was set in the AlGaN/SiN interface of the nitride semiconductor device 3.

When the nitride semiconductor device 3 is produced in accordance with the aforementioned steps of FIG. 6A to FIG. 6G, as shown in FIG. 7, it has been found that the leakage current (Igss) of the gate-to-source path is more greatly reduced than in a case in which the surface 24 of the barrier layer 15 receives ashing damage two times. In FIG. 7, the leakage current Igss of Example 1 is shown as a relative value when the leakage current Igss of Example 2 is assumed as 100%.

Additionally, in the nitride semiconductor device 3, the passivation film 27 is not formed so as to straddle between the adjoining active regions 21, and, in each active region 21, is divided into sections by means of the interlayer insulating film 36 entering the inactive region 20. This makes it possible to relax the stress (tensile stress) of the passivation film 27 more than in a case in which the passivation film 27 (nitride film) is formed in the entirety of the region on the substrate 12.

Additionally, the insulating film directly under the field plate 35 is a nitride film (passivation film 27) that has a comparatively high dielectric constant, and therefore it is possible to sufficiently obtain an electric field relaxation effect etc., by means of the field plate. On the other hand, the interlayer insulating film 36 is an oxide film that has a lower dielectric constant than the nitride film, and therefore, in the active region 21, it is possible to reduce the capacity between the wire 37 and the source electrode 33 and between the wire 37 and the drain electrode 34 that face each other with the interlayer insulating film 36 placed between the wire 37 and the source electrode 33 and placed between the wire 37 and the drain electrode 34.

Figure 8:
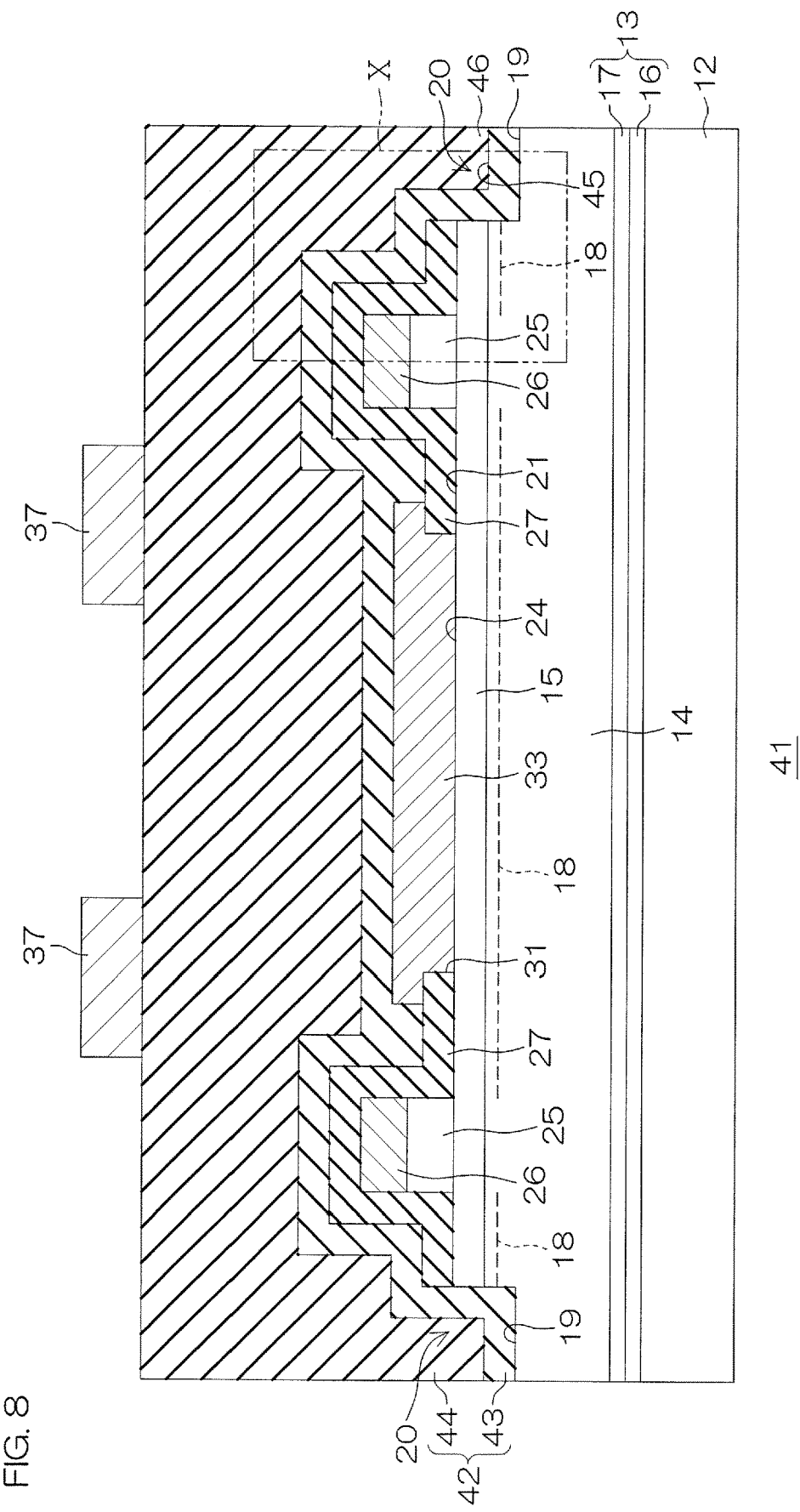
FIG. 8 is a cross-sectional view of the nitride semiconductor device, showing a cross section along line A-A of FIG. 2.
Figure 9:
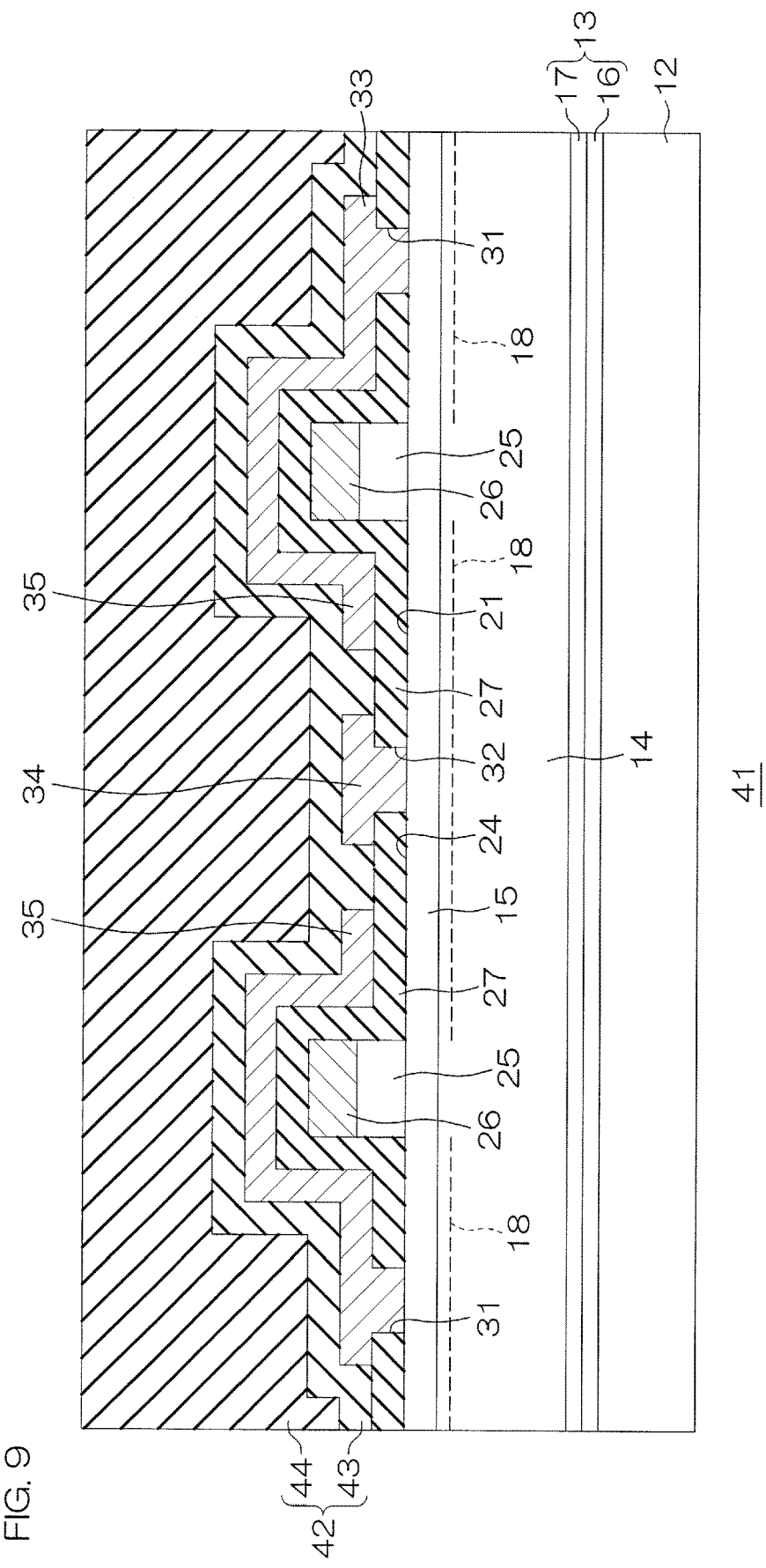
FIG. 9 is a cross-sectional view of the nitride semiconductor device, showing a cross section along line B-B of FIG. 2.

FIG. 8 is a cross-sectional view of a nitride semiconductor device 41 (second form), showing a cross section along line A-A of FIG. 2. FIG. 9 is a cross-sectional view of the nitride semiconductor device 41 (second form), showing a cross section along line B-B of FIG. 2. FIG. 10 is a cross-sectional view in which a main portion of the nitride semiconductor device 41 is enlarged, showing a portion surrounded by an alternate long and two short dashed line X of FIG. 8. The same reference sign is given to each constituent in common to each constituent of FIG. 3 to FIG. 5 mentioned above among constituents shown in FIG. 8 to FIG. 10, and a detailed description thereof is omitted.

This nitride semiconductor device 41 differs from the nitride semiconductor device 3 in including an interlayer insulating film 42 made of a multi-layer film instead of the interlayer insulating film 36 made of a single-layer film.

The interlayer insulating film 42 has a layered structure that is a two-layer structure in the present preferred embodiment and that includes, from the side closer to the substrate 12, a nitride film 43 that is an example of a first film of the present invention and an oxide film 44 that is an example of a second film of the present invention and that is laminated on the nitride film 43.

The nitride film 43 covers the passivation film 27, and further covers the source electrode 33, the drain electrode 34, and the field plate 35. As shown in FIG. 8, the nitride film 43 enters the inactive region 20 that is a concave portion, and comes into contact with the bottom portion 19 and the side portions 22 and 23 (see FIG. 10) of the inactive region 20. Therefore, the boundary between the barrier layer 15 and the passivation film 27 is covered with the nitride film 43. Additionally, the nitride film 43 has a surface 45 at a position lower than the surface 24 of the barrier layer 15 (a position close to the bottom portion 19 of the inactive region 20) in the inactive region 20. Additionally, the nitride film 43 is thinner than the oxide film 44, and has a thickness of, for example, 75 nm to 85 nm.

The oxide film 44 covers the nitride film 43. The oxide film 44 is thicker than the nitride film 43, and has a thickness of, for example, 0.8 μm to 1.2 μm. A wire 37 is formed on a surface of the oxide film 44. Additionally, a portion 46 of the oxide film 44 enters the inactive region 20 through the nitride film 43.

FIG. 11A to FIG. 11H are views showing manufacturing steps of the aforementioned nitride semiconductor device 41 in a process sequence.

In order to manufacture the nitride semiconductor device 41, the buffer layer 13, the channel layer 14, the barrier layer 15, and the first nitride semiconductor layer 38 are formed on the substrate 12 according to, for example, the epitaxial growth method as shown in FIG. 11A. The first nitride semiconductor layer 38 is made of a nitride semiconductor doped with acceptor-type impurities, and, in the present preferred embodiment, is made of the same material as the gate layer 25.

Thereafter, as shown in FIG. 11B, the electrode material film 39 is formed on the first nitride semiconductor layer 38 according to, for example, the sputtering method. The electrode material film 39 is made of a TiN layer, and, in the present preferred embodiment, is made of the same material as the gate electrode 26. Thereafter, the mask 47 is selectively formed on the electrode material film 39. The mask 47 may be made of, for example, a known mask such as a photoresist.

Thereafter, as shown in FIG. 11C, the electrode material film 39 exposed from the mask 47 is selectively removed by etching (for example, dry etching) through the mask 47. Hence, a part of the electrode material film 39 covered with the mask 47 is formed as the gate electrode 26. Thereafter, the mask 47 is removed by ashing or the like.

Figure 11D:
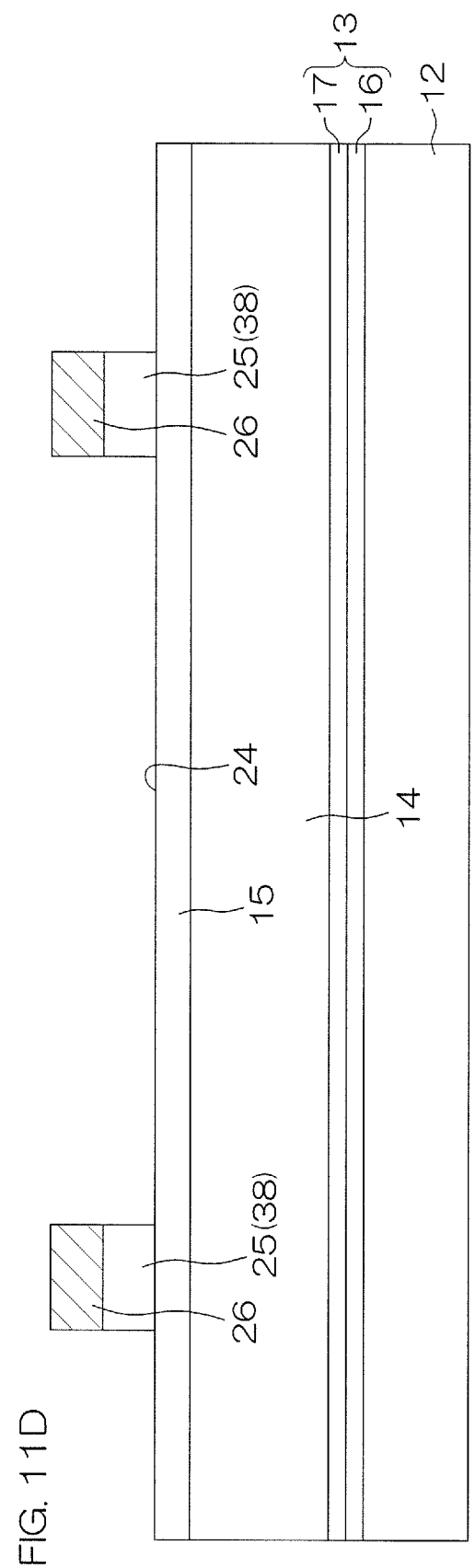

Thereafter, as shown in FIG. 11D, the first nitride semiconductor layer 38 exposed from the gate electrode 26 is selectively removed by etching (for example, dry etching) in which the gate electrode 26 is used as a mask. Hence, a part of the first nitride semiconductor layer 38 covered with the gate electrode 26 is formed as the gate layer 25 that is self-aligning with respect to the gate electrode 26.

Thereafter, as shown in FIG. 11E, the passivation film 27 is formed on the entirety of the surface 24 of the barrier layer 15 so as to cover the gate electrode 26 according to, for example, the CVD method.

Thereafter, as shown in FIG. 11F, the passivation film 27 is selectively removed by, for example, etching (for example, dry etching), and, as a result, the first opening 40 is formed in the passivation film 27. The first opening 40 exposes a part of the barrier layer 15 at which the inactive region 20 is to be formed. Thereafter, the barrier layer 15 and the channel layer 14 are removed successively by means of etching (for example, dry etching) in which the passivation film 27 having the first opening 40 is used as a mask. Hence, the inactive region 20, which is formed in the shape of a concave portion by means of etching, is formed, and the active region 21 is formed in a region covered with the passivation film 27.

Thereafter, as shown in FIG. 11G, the passivation film 27 that has remained on the active region 21 is selectively removed by, for example, etching (for example, dry etching), and, as a result, the source contact hole 31 and the drain contact hole 32 (see FIG. 9) are simultaneously formed. Thereafter, an electrode material film (not shown) is formed on the entirety of the surface of the passivation film 27 according to, for example, the sputtering method. Thereafter, this electrode material film is selectively removed, and, as a result, the source electrode 33 and the drain electrode 34 (see FIG. 9) that are ohmically connected to the barrier layer 15 are formed.

Figure 11H:
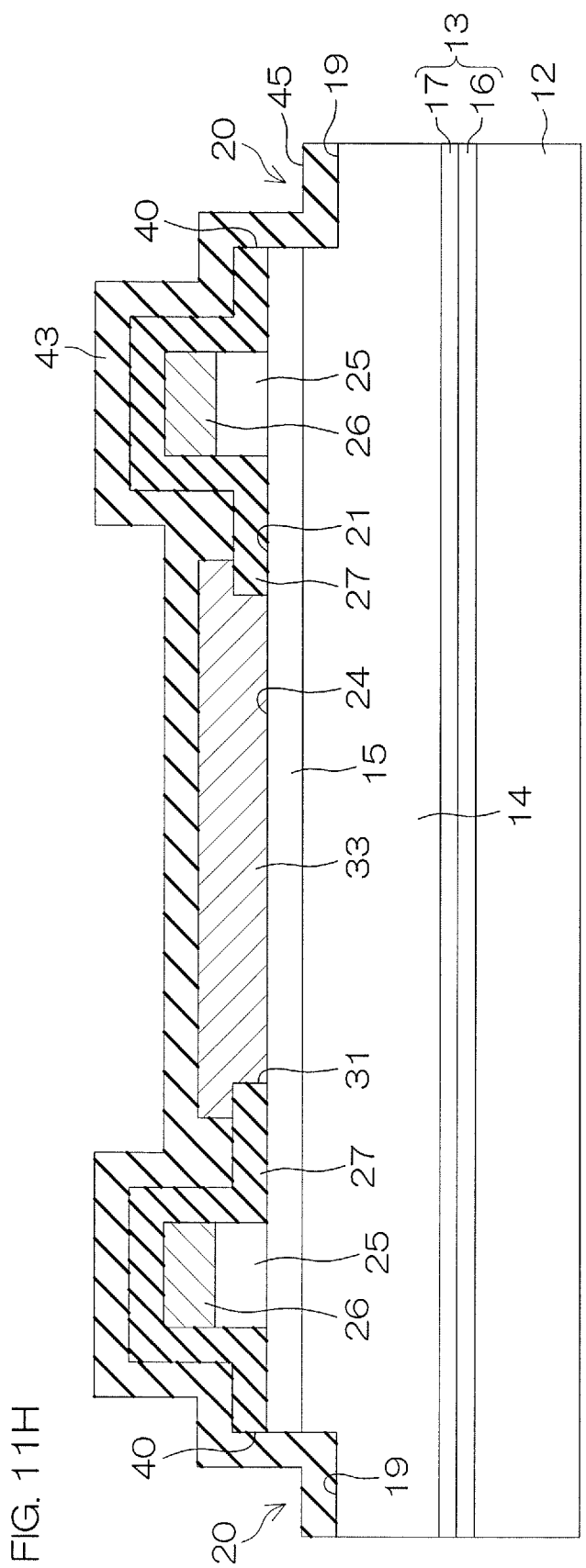

Thereafter, as shown in FIG. 11H, the nitride film 43 is formed in the entirety of the region on the substrate 12 according to, for example, the CVD method. The nitride film 43 covers the passivation film 27 on the active region 21, and enters the inactive region 20, and comes into contact with the bottom portion 19 and the side portions 22 and 23 of the inactive region 20.

Thereafter, as shown in FIG. 8, the oxide film 44 is formed in the entirety of the region on the substrate 12 according to, for example, the CVD method, and, as a result, the interlayer insulating film 42 is formed. Thereafter, the wire 37 is selectively formed on the interlayer insulating film 42, and, as a result, the aforementioned nitride semiconductor device 41 is obtained.

Likewise, according to this method, the inactive region 20 is formed by the removing step in which the passivation film 27 is used as a mask as shown in FIG. 11F. The passivation film 27 is configured to remain as a part of the nitride semiconductor device 3 that is a final product (see FIG. 8 and FIG. 9), and hence is not required to be removed by ashing after finishing the removing step. Additionally, when the gate layer 25 is formed, the gate electrode 26 that is not required to be removed by ashing is used as a mask instead of using a photoresist or the like as a mask as shown in FIG. 11D. Therefore, in a continuous process flow to form the gate layer 25 and the inactive region 20, it is possible to reduce damage that the surface 24 of the barrier layer 15 receives. As a result, it is possible to reduce a leakage current that flows through the interface between the surface 24 of the barrier layer 15 and the passivation film 27 on the surface 24.

Additionally, in the nitride semiconductor device 41, a film being in contact with a GaN layer (channel layer 14) exposed as the first side portion 22 of the inactive region 20 is the nitride film 43 of the interlayer insulating film 42. In the nitride film, it is more difficult to allow a leakage current to occur in the interface with GaN than in the oxide film. Therefore, it is possible to further reduce a leakage current by forming a part, which is in contact with GaN, of the interlayer insulating film 42 as the nitride film 43.

Additionally, in the nitride semiconductor device 41, the nitride film 43 is formed so as to be continuous with the active region 21 and the inactive region 20. Therefore, the nitride film 43 is not divided into sections in each active region 21 like the passivation film 27 of the nitride semiconductor device 3. However, the portion 46 of the oxide film 44 enters the inactive region 20 as shown in FIG. 10. This makes it possible to surround the nitride film 43 on the active region 21 by means of the oxide film 44 that has entered the inactive region 20 around its perimeter. As a result, it is possible to relax the stress (tensile stress) of the nitride film 43 in the same way as the nitride semiconductor device 3.

Figure 12:
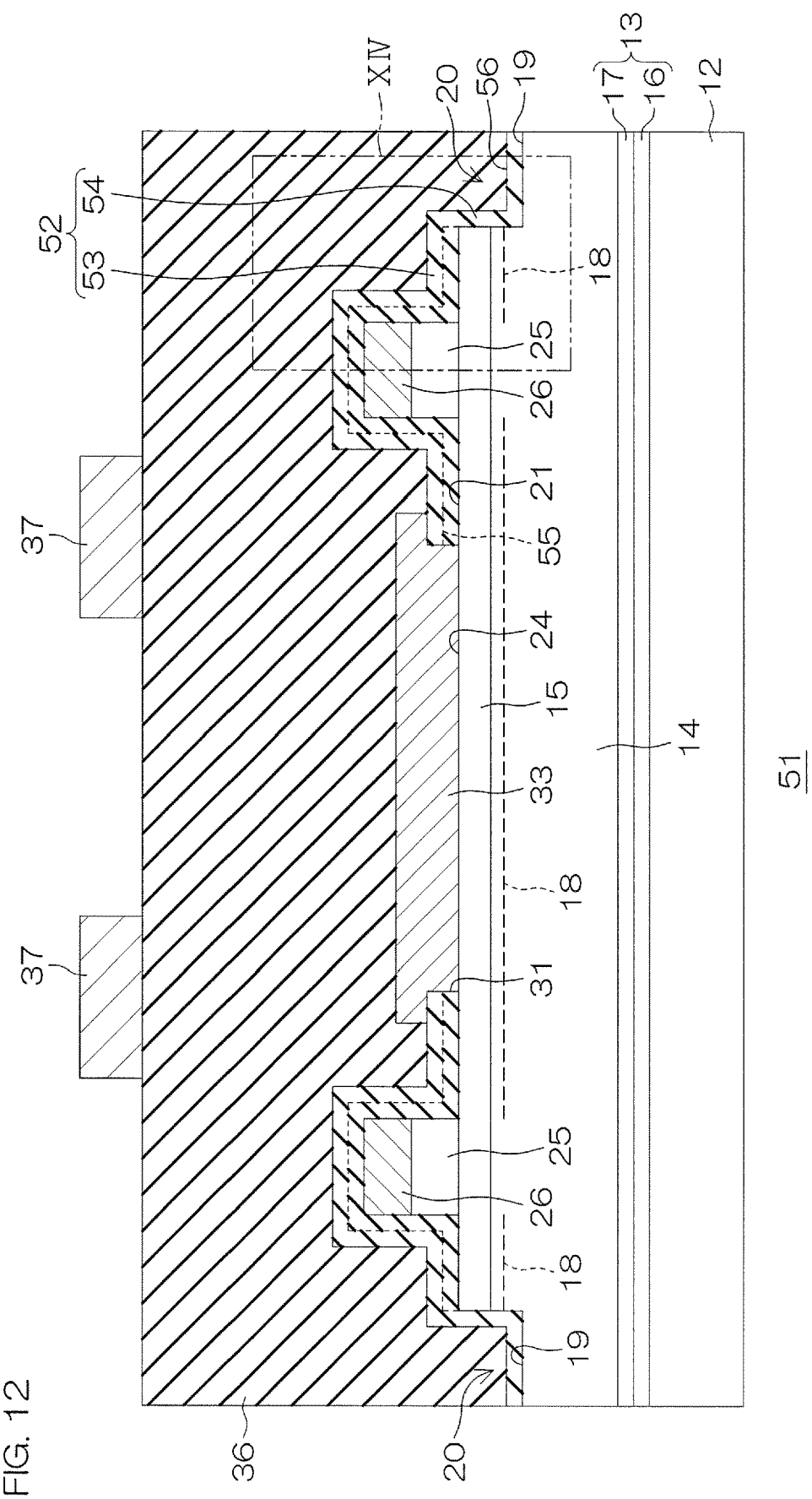
FIG. 12 is a cross-sectional view of the nitride semiconductor device, showing a cross section along line A-A of FIG. 2.
Figure 13:
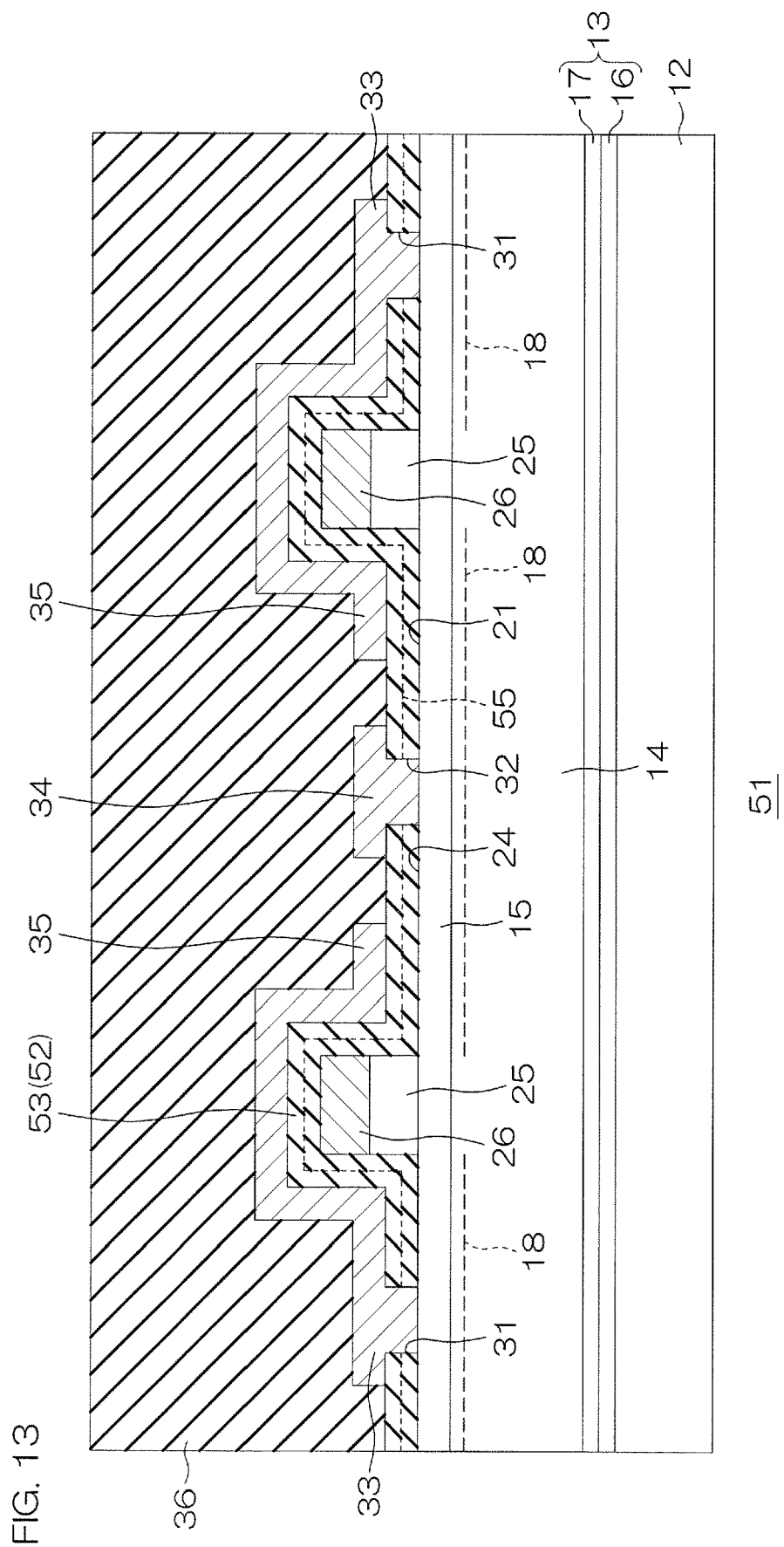
FIG. 13 is a cross-sectional view of the nitride semiconductor device, showing a cross section along line B-B of FIG. 2.
Figure 14:
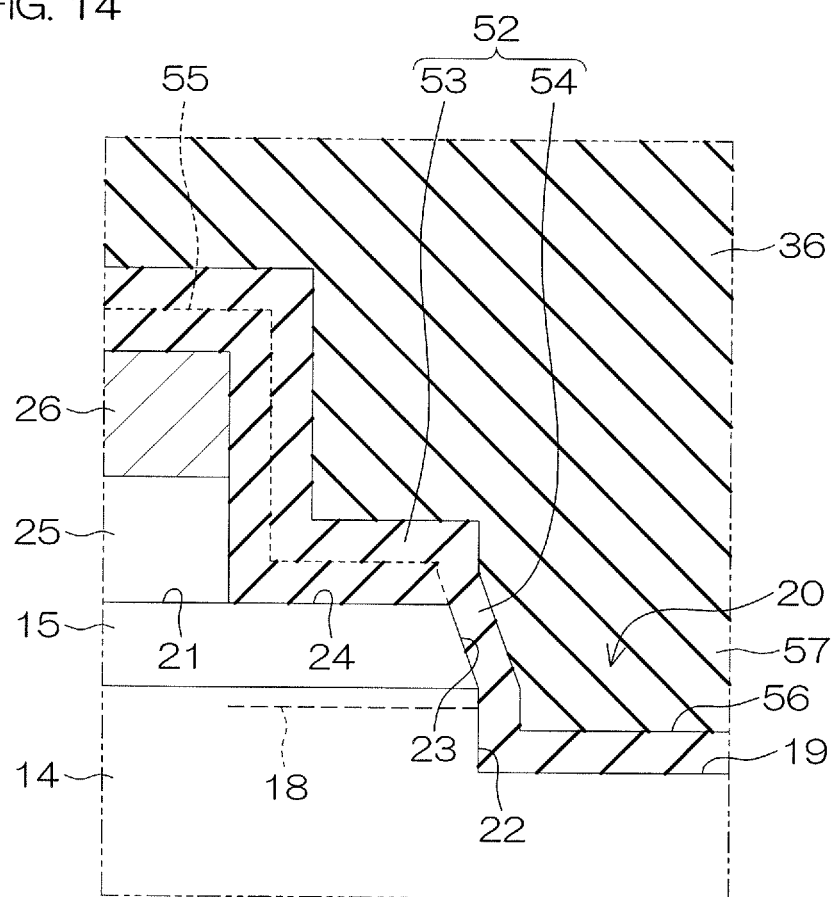
FIG. 14 is a cross-sectional view in which a main portion of the nitride semiconductor device is enlarged, showing a portion surrounded by an alternate long and two short dashed line XIV of FIG. 12.

FIG. 12 is a cross-sectional view of a nitride semiconductor device 51 (third form), showing a cross section along line A-A of FIG. 2. FIG. 13 is a cross-sectional view of the nitride semiconductor device 51 (third form), showing a cross section along line B-B of FIG. 2. FIG. 14 is a cross-sectional view in which a main portion of the nitride semiconductor device 51 is enlarged, showing a portion surrounded by an alternate long and two short dashed line XIV of FIG. 12. The same reference sign is given to each constituent in common to each constituent of FIG. 3 to FIG. 5 mentioned above among constituents shown in FIG. 12 to FIG. 14, and a detailed description thereof is omitted.

This nitride semiconductor device 51 differs from the nitride semiconductor device 3 in including a passivation film 52 that is an example of a third insulating film of the present invention with which the active region 21 and the inactive region 20 are covered instead of the passivation film 27 formed only in a region on the active region 21.

The passivation film 52 is made of a nitride film (for example, SiN film) in the present preferred embodiment, and includes a first portion 53 formed in the active region 21 so as to cover the gate electrode 26 and the gate layer 25 and a second portion 54 that extends integrally from the first portion 53 to the inactive region 20 and that is in contact with the bottom portion 19 and the side portions 22 and 23 of the inactive region 20. As described later, the passivation film 52 is formed by laminating a first passivation film 58 and a second passivation film 60 together. Therefore, in FIG. 12, a boundary 55 between the first passivation film 58 and the second passivation film 60 is virtually shown.

The first portion 53 of the passivation film 52 covers the layered structure including the gate layer 25 and the gate electrode 26 so as to become contiguous to the upper surface and the lateral surface of this layered structure, and the first portion 53 of the passivation film 52 is in contact with the surface 24 of the barrier layer 15 in the active region 21. Preferably, the thickness of the first portion 53 of the passivation film 52 is 100 nm or more, and is, for example, 100 nm to 120 nm. If its thickness falls within this range, it is possible to effectively fulfill electric field relaxation by means of the field plate 35 on the first portion 53 of the passivation film 52.

On the other hand, the second portion 54 of the passivation film 52 is in contact with the bottom portion 19 and the side portions 22 and 23 of the inactive region 20. The second portion 54 of the passivation film 52 has its surface 56 at a position lower than the surface 24 of the barrier layer 15 (a position close to the bottom portion 19 of the inactive region 20) in the inactive region 20. Therefore, a portion 57 of the interlayer insulating film 36 enters the inactive region 20 through the second portion 54 of the passivation film 52 as shown in FIG. 14.

Additionally, the second portion 54 of the passivation film 52 is thinner than the first portion 53, and has a thickness of, preferably, 50 nm or less, and, for example, 20 nm to 30 nm.

FIG. 15A to FIG. 15H are views showing manufacturing steps of the aforementioned nitride semiconductor device 3 in a process sequence.

In order to manufacture the nitride semiconductor device 3, the buffer layer 13, the channel layer 14, the barrier layer 15, and the first nitride semiconductor layer 38 are formed on the substrate 12 according to, for example, the epitaxial growth method as shown in FIG. 15A. The first nitride semiconductor layer 38 is made of a nitride semiconductor doped with acceptor-type impurities, and, in the present preferred embodiment, is made of the same material as the gate layer 25.

Thereafter, as shown in FIG. 15B, the electrode material film 39 is formed on the first nitride semiconductor layer 38 according to, for example, the sputtering method. The electrode material film 39 is made of a TiN layer, and, in the present preferred embodiment, is made of the same material as the gate electrode 26. Thereafter, the mask 47 is selectively formed on the electrode material film 39. The mask 47 may be made of, for example, a known mask such as a photoresist.

Figure 15C:
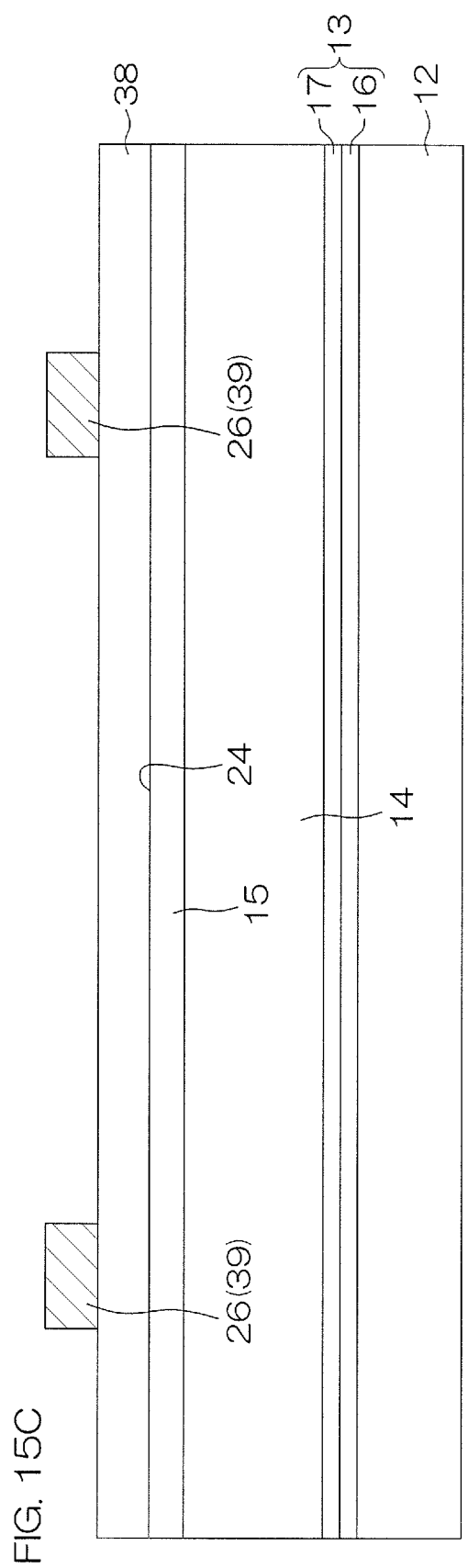

Thereafter, as shown in FIG. 15C, the electrode material film 39 exposed from the mask 47 is selectively removed by etching (for example, dry etching) through the mask 47. Hence, a part of the electrode material film 39 covered with the mask 47 is formed as the gate electrode 26. Thereafter, the mask 47 is removed by ashing or the like.

Figure 15D:
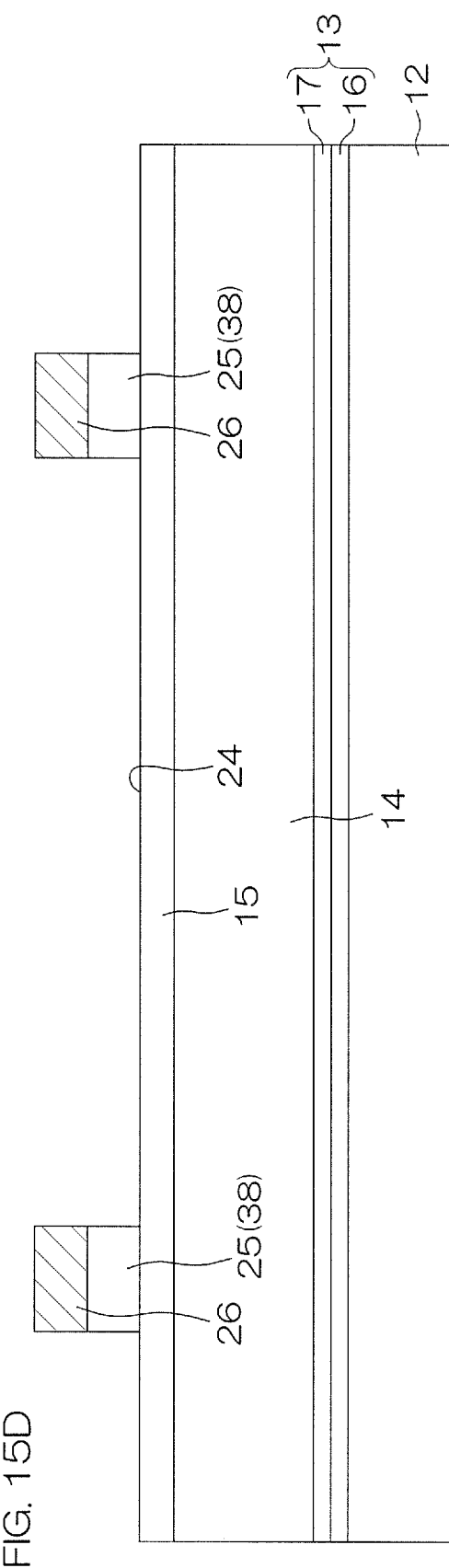

Thereafter, as shown in FIG. 15D, the first nitride semiconductor layer 38 exposed from the gate electrode 26 is selectively removed by etching (for example, dry etching) in which the gate electrode 26 is used as a mask. Hence, a part of the first nitride semiconductor layer 38 covered with the gate electrode 26 is formed as the gate layer 25 that is self-aligning with respect to the gate electrode 26.

Thereafter, as shown in FIG. 15E, the first passivation film 58 that is an example of a fourth insulating film of the present invention is formed on the entirety of the surface 24 of the barrier layer 15 so as to cover the gate electrode 26 according to, for example, the CVD method. The first passivation film 58 is made of a nitride film (for example, SiN film) in the present preferred embodiment.

Thereafter, as shown in FIG. 15F, the first passivation film 58 is selectively removed by, for example, etching (for example, dry etching), and, as a result, a second opening 59 is formed in the first passivation film 58. The second opening 59 exposes a part of the barrier layer 15 at which the inactive region 20 is to be formed. Thereafter, the barrier layer 15 and the channel layer 14 are removed successively by means of etching (for example, dry etching) in which the first passivation film 58 having the second opening 59 is used as a mask. Hence, the inactive region 20, which is formed in the shape of a concave portion by means of etching, is formed, and the active region 21 is formed in a region covered with the first passivation film 58.

Figure 15G:
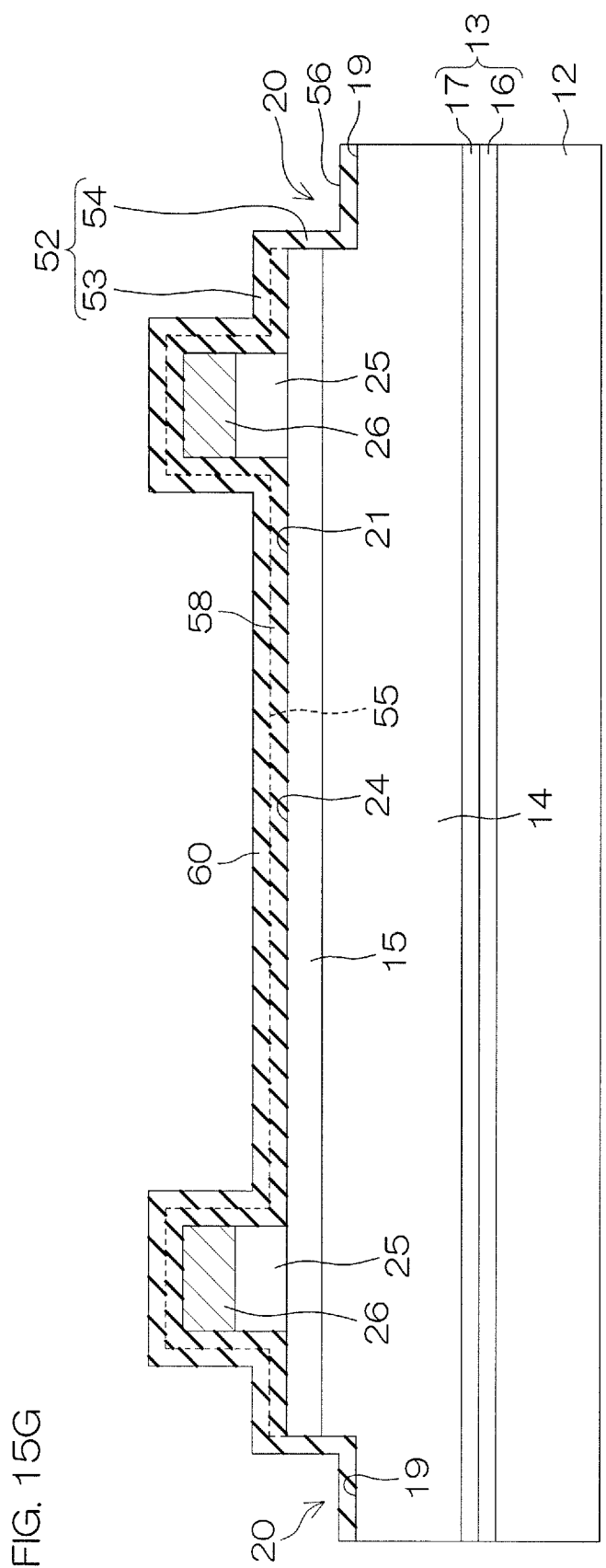

Thereafter, as shown in FIG. 15G, the second passivation film 60 that is an example of a fifth insulating film of the present invention is formed in the entirety of the region on the substrate 12 according to, for example, the CVD method. The second passivation film 60 covers the first passivation film 58 on the active region 21, and enters the inactive region 20, and comes into contact with the bottom portion 19 and the side portions 22 and 23 of the inactive region 20. Hence, the passivation film 52 is formed. The second passivation film 60 is made of a nitride film (for example, SiN film) that is the same material as the first passivation film 58 in the present preferred embodiment.

Figure 15H:
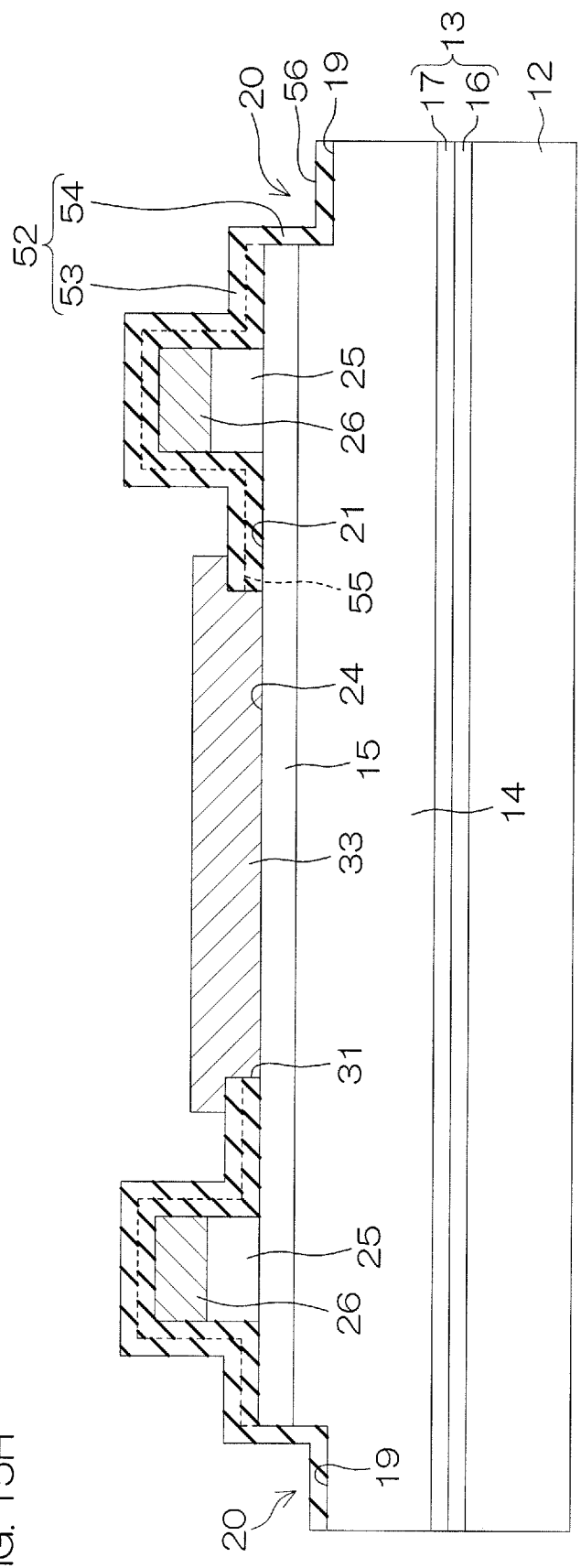

Thereafter, as shown in FIG. 15H, the passivation film 52 on the active region 21 is selectively removed by, for example, etching (for example, dry etching), and, as a result, the source contact hole 31 and the drain contact hole 32 (see FIG. 13) are simultaneously formed. Thereafter, an electrode material film (not shown) is formed on the entirety of the surface of the passivation film 52 according to, for example, the sputtering method. Thereafter, this electrode material film is selectively removed, and, as a result, the source electrode 33 and the drain electrode 34 (see FIG. 13) that are ohmically connected to the barrier layer 15 are formed.

Thereafter, as shown in FIG. 12, the interlayer insulating film 36 that is an example of a sixth insulating film of the present invention is formed in the entirety of the region on the substrate 12 according to, for example, the CVD method. Thereafter, the wire 37 is selectively formed on the interlayer insulating film 36, and, as a result, the aforementioned nitride semiconductor device 51 is obtained.

Likewise, according to this method, the inactive region 20 is formed by the removing step in which the first passivation film 58 is used as a mask as shown in FIG. 11F. The first passivation film 58 is configured to remain as a part of the passivation film 52 of the nitride semiconductor device 3 that is a final product, and hence is not required to be removed by ashing after finishing the removing step. Additionally, when the gate layer 25 is formed, the gate electrode 26 that is not required to be removed by ashing is used as a mask instead of using a photoresist or the like as a mask as shown in FIG. 15D. Therefore, in a continuous process flow to form the gate layer 25 and the inactive region 20, it is possible to reduce damage that the surface 24 of the barrier layer 15 receives. As a result, it is possible to reduce a leakage current that flows through the interface between the surface 24 of the barrier layer 15 and the passivation film 27 on the surface 24.

Additionally, in the nitride semiconductor device 41, a film being in contact with the GaN layer (channel layer 14) exposed as the first side portion 22 of the inactive region 20 is the passivation film 52 made of a nitride film. In the nitride film, it is more difficult to allow a leakage current to occur in the interface with GaN than in the oxide film. Therefore, it is possible to further reduce a leakage current by forming the film, which is in contact with GaN exposed to the inactive region 20, as the passivation film 52 made of a nitride film.

Additionally, in the nitride semiconductor device 51, the passivation film 52 is formed so as to be continuous with the active region 21 and the inactive region 20. Therefore, the nitride film 43 is not divided into sections in each active region 21 like the passivation film 27 of the nitride semiconductor device 3. However, the portion 57 of the interlayer insulating film 36 enters the inactive region 20 as shown in FIG. 14. This makes it possible to surround the passivation film 52 on the active region 21 by means of the interlayer insulating film 36 that has entered the inactive region 20 around its perimeter. As a result, it is possible to relax the stress (tensile stress) of the passivation film 52 in the same way as the nitride semiconductor device 3.

Although one preferred embodiment of the present invention has been described as above, the present invention can be embodied in other modes.

For example, the channel layer 14 is made of GaN, and the barrier layer 15 is made of AlGaN or AlN as described in the above preferred embodiment, and yet the channel layer 14 and the barrier layer 15 are merely required to differ from each other in Al composition, and other combinations can be employed. The combination of barrier layer/channel layer may be any one of AlGaN layer/GaN layer, AlGaN layer/AlGaN layer (differing in Al composition), AlInN layer/AlGaN layer, AlInN layer/GaN layer, AlN layer/GaN layer, and AlN layer/AlGaN layer. More generally, the barrier layer includes Al and N in the composition. The channel layer includes Ga and N in the composition, and differs in Al composition from the barrier layer. A difference in Al composition between the barrier layer and the channel layer causes a lattice mismatch therebetween, and, as a result, carriers resulting from polarization contribute to the formation of a two-dimensional electron gas.

Besides, various design changes can be made within the scope of the matters mentioned in the claims.

What is claimed is:

1. A nitride semiconductor device comprising:
   a channel layer made of a nitride semiconductor;
   a barrier layer that is formed on the channel layer and that is made of $Al_xIn_yGa_{1-x-y}N$ (x>0, x+y≤1);
   an active region that has a layered structure including the channel layer and the barrier layer;
   an inactive region that is formed at the layered structure around the active region and that is a concave portion having a bottom portion that reaches the channel layer;
   a gate layer that is selectively formed on the barrier layer in the active region and that is made of a nitride semiconductor;
   a gate electrode formed on the gate layer;
   a first insulating film that covers the gate electrode and that is in contact with the barrier layer in the active region; and
   a second insulating film that covers the first insulating film and that is in contact with the inactive region, wherein
   the second insulating film is a multi-layer film,
   the first insulating film is a nitride film, and
   the second insulating film includes a layered structure including a nitride film and an oxide film disposed on the nitride film.

2. The nitride semiconductor device according to claim 1, further comprising an ohmic electrode that is formed on the first insulating film, that is covered with the second insulating film, and that is ohmically connected to the barrier layer through the first insulating film.

3. The nitride semiconductor device according to claim 2, wherein the ohmic electrode includes a source electrode and a drain electrode between which the gate electrode is placed.

4. The nitride semiconductor device according to claim 3, wherein
   the source electrode and the drain electrode have a rectangle shape in a plan view, and
   a plurality of the source electrodes and the drain electrodes are alternately arranged such that long side directions thereof are parallel to each other.

5. The nitride semiconductor device according to claim 1, wherein the gate layer is formed in a self-aligned manner with respect to the gate electrode.

6. The nitride semiconductor device according to claim 1, wherein the concave portion has a depth deeper than a depth position of a two-dimensional electron gas in the layered structure of the active region.

7. The nitride semiconductor device according to claim 1, wherein the concave portion has a side portion that is tilted with respect to a surface of the barrier layer.

8. The nitride semiconductor device according to claim 1, wherein the first insulating film has an end surface that in continuous with an end surface of the barrier layer.

9. The nitride semiconductor device according to claim 1, wherein a plurality of the gate electrodes are surrounded by the inactive region.

10. The nitride semiconductor device according to claim 1, wherein the barrier layer has a thickness from 10 nm to 20 nm.

11. The nitride semiconductor device according to claim 1, wherein the first insulating film has a thickness from 90 nm to 110 nm.

12. The nitride semiconductor device according to claim 1, wherein the second insulating film has a thickness from 0.8 μm to 1.2 μm.

13. The nitride semiconductor device according to claim 1, wherein the channel layer is made of a GaN layer.

14. The nitride semiconductor device according to claim 1, wherein the gate layer is made of a GaN layer doped with an acceptor-type impurity.

15. A method for manufacturing a nitride semiconductor device, the method comprising:
   a step of forming a barrier layer made of $Al_xIn_yGa_{1-x-y}N$ (x>0, x+y≤1) on a channel layer made of a nitride semiconductor;
   a step of forming a first nitride semiconductor layer on the barrier layer;
   a step of selectively forming a gate electrode on the first nitride semiconductor layer;
   a step of forming a gate layer made of the first nitride semiconductor layer directly under the gate electrode by selectively removing a part of the first nitride semiconductor layer while using the gate electrode as a mask;
   a step of forming a first insulating film on the barrier layer so as to cover the gate electrode;
   a step of forming a first opening in the first insulating film by selectively removing a part of the first insulating film;
   a step of forming an inactive region that is a concave portion whose bottom portion reaches the channel layer by removing the barrier layer and the channel layer successively from the first opening while using the first insulating film as a mask; and a step of forming a second insulating film so as to be brought into contact with the inactive region and cover the first insulating film.

16. The method for manufacturing a nitride semiconductor device according to claim 15, wherein the step of forming the second insulating film includes a step of forming a first film made of the same material as the first insulating film so as to be brought into contact with the inactive region and a step of forming a second film made of a different material from the material of the first insulating film on the first film.

* * * * *